US012654388B2

(12) United States Patent
Vella et al.

(10) Patent No.: US 12,654,388 B2
(45) Date of Patent: *Jun. 16, 2026

(54) THERMALLY CURABLE PIEZOELECTRIC COMPOSITES AND USE THEREOF IN ADDITIVE MANUFACTURING

(71) Applicants: XEROX CORPORATION, Norwalk, CT (US); NATIONAL RESEARCH COUNCIL OF CANADA, Ottawa (CA)

(72) Inventors: Sarah J. Vella, Milton (CA); Alexandros Vasileiou, Toronto (CA); Yujie Zhu, Mississauga (CA); Edward G. Zwartz, Mississauga (CA); Chantal Paquet, Ottawa (CA)

(73) Assignees: XEROX CORPORATION, Norwalk, CT (US); NATIONAL RESEARCH COUNCIL OF CANADA, Ottawa (CA)

( * ) Notice: Subject to any disclaimer, the term of this patent is extended or adjusted under 35 U.S.C. 154(b) by 857 days.

This patent is subject to a terminal disclaimer.

(21) Appl. No.: 17/996,476

(22) PCT Filed: Mar. 22, 2022

(86) PCT No.: PCT/US2022/021334
§ 371 (c)(1),
(2) Date: Oct. 18, 2022

(87) PCT Pub. No.: WO2022/204135
PCT Pub. Date: Sep. 29, 2022

(65) Prior Publication Data
US 2023/0212405 A1      Jul. 6, 2023

Related U.S. Application Data

(60) Provisional application No. 63/164,679, filed on Mar. 23, 2021.

(51) Int. Cl.
*B29C 64/118*      (2017.01)
*B29C 48/05*      (2019.01)
(Continued)

(52) U.S. Cl.
CPC ............ *B29C 64/118* (2017.08); *B29C 48/05* (2019.02); *B29C 64/10* (2017.08); *B29C 64/165* (2017.08); *B29C 64/314* (2017.08); *B29C 64/40* (2017.08); *B33Y 10/00* (2014.12); *B33Y 40/10* (2020.01); *B33Y 70/10* (2020.01); *B33Y 80/00* (2014.12); *C08L 23/06* (2013.01); *C08L 25/06* (2013.01); *C08L 53/005* (2013.01); *C08L 53/02* (2013.01); *C08L 67/04* (2013.01); *C08L 71/02* (2013.01); *C09D 4/06* (2013.01); *C09D 5/24* (2013.01); *C09D 7/61*

(2018.01); *C09D 7/62* (2018.01); *C09D 7/63* (2018.01); *C09D 7/69* (2018.01); *C09D 7/70* (2018.01); *C09D 167/04* (2013.01);
(Continued)

(58) Field of Classification Search
CPC ........... B29C 64/118; B29C 3/04; B29C 3/10; B29C 3/165; B29C 48/05; H10N 30/092; H10N 30/852; B33Y 10/10; B33Y 40/10; B33Y 40/20; B33Y 70/10; B29K 2101/12; B29K 2103/04; B29K 2105/0002; B29K 2105/002; B29K 2105/24
See application file for complete search history.

(56) References Cited

U.S. PATENT DOCUMENTS 10,392,521 B2      8/2019   Ng et al.
2016/0181506 A1      6/2016   Sirbuly et al.
(Continued)

FOREIGN PATENT DOCUMENTS

CN      111154253 A      5/2020
CN      111187073 A      5/2020
(Continued)

OTHER PUBLICATIONS

Cholleti, E.R., "A Review on 3D printing of piezoelectricmaterials," IOP Conf. Ser.: Mater. Sci. Eng., 2018, 012046 (18 pp.), 2018.
(Continued)

*Primary Examiner* — C Melissa Koslow
(74) *Attorney, Agent, or Firm* — Vorys, Sater, Seymour and Pease LLP

(57) ABSTRACT

Parts made by additive manufacturing are often structural in nature, rather than having functional properties conveyed by a polymer or other component present therein. Printed parts having piezoelectric properties may be formed using compositions comprising a plurality of piezoelectric particles and a polymer material comprising at least one thermoplastic polymer and at least one thermally curable polymer precursor. At a sufficient temperature, the at least one thermally curable polymer precursor may undergo a reaction, optionally also undergoing a reaction with the piezoelectric particles, and form an at least partially cured printed part. The piezoelectric particles may be mixed with the polymer material and remain substantially non-agglomerated when combined with the polymer material. The compositions may define a form factor such as a composite filament, a composite pellet, or an extrudable composite paste, which may be utilized in forming printed part by extrusion, layer-by-layer deposition, and thermal curing.

19 Claims, 2 Drawing Sheets

(51) Int. Cl.

| | |
|---|---|
| B29C 64/10 | (2017.01) |
| B29C 64/165 | (2017.01) |
| B29C 64/314 | (2017.01) |
| B29C 64/40 | (2017.01) |
| B33Y 10/00 | (2015.01) |
| B33Y 40/10 | (2020.01) |
| B33Y 70/10 | (2020.01) |
| B33Y 80/00 | (2015.01) |
| C08L 23/06 | (2006.01) |
| C08L 25/06 | (2006.01) |
| C08L 53/00 | (2006.01) |
| C08L 53/02 | (2006.01) |
| C08L 67/04 | (2006.01) |
| C08L 71/02 | (2006.01) |
| C09D 4/06 | (2006.01) |
| C09D 5/24 | (2006.01) |
| C09D 7/40 | (2018.01) |
| C09D 7/61 | (2018.01) |
| C09D 7/62 | (2018.01) |
| C09D 7/63 | (2018.01) |
| C09D 167/04 | (2006.01) |
| H10N 30/092 | (2023.01) |
| H10N 30/85 | (2023.01) |
| B29K 23/00 | (2006.01) |
| B29K 25/00 | (2006.01) |
| B29K 33/00 | (2006.01) |
| B29K 67/00 | (2006.01) |
| B29K 101/12 | (2006.01) |
| B29K 105/00 | (2006.01) |
| B29K 105/04 | (2006.01) |
| B29K 105/16 | (2006.01) |
| B29K 505/08 | (2006.01) |
| B29K 507/04 | (2006.01) |
| B29K 509/00 | (2006.01) |
| B29K 509/02 | (2006.01) |
| C08K 3/04 | (2006.01) |
| C08K 3/22 | (2006.01) |
| C08K 7/06 | (2006.01) |
| C08K 9/04 | (2006.01) |

(52) U.S. Cl.

CPC ......... *H10N 30/092* (2023.02); *H10N 30/852* (2023.02); *B29K 2023/18* (2013.01); *B29K 2025/08* (2013.01); *B29K 2033/08* (2013.01); *B29K 2033/12* (2013.01); *B29K 2067/00* (2013.01); *B29K 2067/04* (2013.01); *B29K 2101/12* (2013.01); *B29K 2105/002* (2013.01); *B29K 2105/0023* (2013.01); *B29K 2105/0085* (2013.01); *B29K 2105/0088* (2013.01); *B29K 2105/04* (2013.01); *B29K 2105/16* (2013.01); *B29K 2105/162* (2013.01); *B29K 2505/08* (2013.01); *B29K 2507/04* (2013.01); *B29K 2509/00* (2013.01); *B29K 2509/02* (2013.01); *B29K 2995/0003* (2013.01); *B29K 2995/0005* (2013.01); *B29K 2995/0077* (2013.01); *C08K 3/04* (2013.01); *C08K 2003/2234* (2013.01); *C08K 2003/2237* (2013.01); *C08K 2003/2244* (2013.01); *C08K 7/06* (2013.01); *C08K 9/04* (2013.01); *C08K 2201/001* (2013.01); *C08K 2201/005* (2013.01); *C08K 2201/011* (2013.01); *C08L 2205/025* (2013.01); *C08L 2207/04* (2013.01); *C08L 2207/062* (2013.01)

(56) References Cited

U.S. PATENT DOCUMENTS

| | | |
|---|---|---|
| 2016/0322560 A1 | 11/2016 | Sirbuly et al. |
| 2017/0148539 A1 | 5/2017 | Prestayko et al. |
| 2018/0141274 A1 | 5/2018 | Fink et al. |
| 2019/0054659 A1 | 2/2019 | Tseng et al. |
| 2019/0181331 A1 | 6/2019 | Lee et al. |
| 2019/0284423 A1 | 9/2019 | Bodkhe et al. |
| 2019/0365541 A1* | 12/2019 | Friis ..................... H10N 30/092 |
| 2020/0283651 A1 | 9/2020 | Wright et al. |
| 2020/0357979 A1 | 11/2020 | Kim et al. |
| 2021/0234089 A1 | 7/2021 | Zheng et al. |
| 2022/0069195 A1 | 3/2022 | Markanday et al. |

FOREIGN PATENT DOCUMENTS

| | | | | |
|---|---|---|---|---|
| GB | 2224738 A | * | 5/1990 | ............. C08L 53/00 |
| KR | 20210012731 A | | 2/2021 | |
| WO | WO-2016126962 A1 | * | 8/2016 | ............. B33Y 70/10 |
| WO | 2019227082 A1 | | 11/2019 | |

OTHER PUBLICATIONS

Kim, H., et al., "Fabrication and Characterization of 3D printed BaTiO3/PVDF nanocomposites," J. Comp. Mater., 2018, pp. 197-206, 52.

Wu, Y., et al., "Fabrication of Composite Filaments with High Dielectric Permittivity for Fused Deposition 3D Printing," Materials, 2017, 1218 (11 pp.), 10.

Killic, A., et al., "Improving electret properties of PP filaments with barium titanate," J. Electrostatics, 2013, pp. 41-47, 2013.

Chiolerio, A., et al., "Effect of the fabrication method on the functional properties of BaTiO3:PVDF nanocomposites" J. Mater. Sci., 2013, pp. 6943-6951, 48.

Kim, K., et al., "3D Optical Printing of Piezoelectric Nanoparticle-Polymer Composite Materials," ACS Nano, 2014, pp. 9799-9806, 8.

Kim, K., et al., "Tunable Surface and Matrix Chemistries in Optically Printed (0-3) Pizeoelectric Nanocomposites," ACS App. Mater. Interfaces, 2016, pp. 33394-33398, 8.

Konuray, O. et al., "Dual-curable stereolithography resins for superior thermomechanical properties", Express polymer letters, 2020, pp. 881-894, 14.

Salaeh, S., "Processing of natural rubber composites and blends : relation between structure and properties," Materials Science [cond-mat.mtrl-sci]. Université Claude Bernard—Lyon I; Prince of Songkla University, 2014.

Fenouillot, F., et al., "Uneven distribution of nanoparticles in immiscible fluids: Morphology development in polymer blends," Polymer, 2009, pp. 1333-1350, 50.

Martinez-Ayuso, G., et al., "Homogenization of porous piezoelectric materials," International Journal of Solids and Structures, 2017, pp. 218-229, 113-114.

Bai, L., et al., "Kinetic Control of Graphene Localization in Co-continuous Polymer Blends via Melt Compounding," Langmuir, 2018, pp. 1073-1083, 34.

Guan, X., et al., "PZT/PVDF composites doped with carbon nanotubes," Sensors and Actuators A: Physical, 2013, pp. 228-231, 194.

Li, W., et al., "Enhancing conjugation degree and interfacial interactions to enhance dielectric properties of noncovalent functionalized graphene/poly (vinylidene fluoride) composites," Carbon, 2019, pp. 728-738, 141.

Li, W., et al., "The Control of Silica Nanoparticles on the Phase Separation of Poly(methyl methacrylate)/Poly(styrene-co-acrylonitrile) Blends," Macromol. Chem. Phys., 2013, pp. 2705-2715, 214.

McCall W.R., et al., "Piezoelectric nanoparticle-polymer composite foams," ACS Appl. Mater. Interfaces, 2014, pp. 19504-19509, 6.

Utracki, L., "Compatibilization of Polymer Blends," Canadian Journal of Chemical Engineering, 2002, pp. 1008-1016, 80.

(56)          References Cited

OTHER PUBLICATIONS

Vasileiou, A., et al., "A Noncovalent Compatibilization Approach to Improve the Filler Dispersion and Properties of Polyethylene/ Graphene Composites," ACS Appl. Mater. Interfaces, 2014, pp. 1916-1925, 6.

Yao, D., et al., "3D Printed Nanocomposites: Achieving the Upper Bound of Piezoelectric Response in Tunable, Wearable 3D Printed Nanocomposites," Adv. Funct. Mater., 2019, p. 1970289, 29.

Zhao, P., et al., "Properties of cement-sand-based piezoelectric composites with carbon nanotubes modification," Ceramics International, 2916, pp. 15030-15034, 42.

Written Opinion and International Search Report from corresponding PCT Application No. PCT/US2022/021334 mailed Jul. 4, 2022.

* cited by examiner

THERMALLY CURABLE PIEZOELECTRIC COMPOSITES AND USE THEREOF IN ADDITIVE MANUFACTURING

FIELD

The present disclosure generally relates to additive manufacturing and, more particularly, extrudable compositions suitable for additive manufacturing to form printed parts exhibiting piezoelectric properties.

BACKGROUND

Additive manufacturing, also known as three-dimensional (3-D) printing, is a rapidly growing technology area. Although additive manufacturing has traditionally been used for rapid prototyping activities, this technique is being increasingly employed for producing commercial and industrial parts in any number of complex shapes. Additive manufacturing processes typically operate by building an object (part) layer-by-layer, for example, by 1) depositing a stream of molten printing material obtained from a continuous filament or other printing material source, 2) sintering powder particulates of a printing material using a laser, or 3) direct writing using an extrudable paste composition. The layer-by-layer deposition usually takes place under control of a computer to deposit the printing material in precise locations based upon a digital three-dimensional "blueprint" of the part to be manufactured, with consolidation of the printing material often taking place in conjunction with deposition to form the printed part. The printing material forming the body of a printed part may be referred to as a "build material" herein.

Additive manufacturing processes employing a stream of molten printing material for part formation may utilize a thermoplastic polymer filament as a source of the molten printing material. Such additive manufacturing processes are sometimes referred to as "fused deposition modeling" or "fused filament fabrication" processes. The latter term is used herein.

Additive manufacturing processes employing thermoplastic polymer pellets or other polymer forms as a source of printing material are also known. Extrudable paste compositions comprising thermoplastic polymers or curable polymer precursors (resins) may also be utilized in similar direct writing additive manufacturing processes.

Additive manufacturing processes employing powder particulates of a printing material oftentimes perform directed heating in selected locations of a particulate bed (powder bed) following printing material deposition to promote coalescence of the powder particulates into a consolidated part. Techniques suitable for promoting consolidation of powder particulates to form a consolidated part include, for example, Powder Bed Fusion (PBF), selective laser sintering (SLS), Electron Beam Melting (EBM), Binder Jetting and Multi-Jet Fusion (MJF).

A wide range of parts having various shapes may be fabricated using the foregoing additive manufacturing processes. In many instances, build materials employed in such additive manufacturing processes may be largely structural in nature, rather than the polymer having an innate functionality itself. One exception is piezoelectric functionality, which may be exhibited in printed objects formed from polyvinylidene fluoride, a polymer which possesses innate piezoelectric properties upon poling. Piezoelectric materials generate charge under mechanical strain or, conversely, undergo mechanical strain when a potential is applied thereto. Potential applications for piezoelectric materials include, for example, sensing, switching, actuation, and energy harvesting.

Despite the desirability of forming printed parts having piezoelectric properties, there are only limited options for doing so at present. Other than polyvinylidene fluoride, the range of piezoelectric polymers is rather limited, and some alternative polymers are not suitable for being printed in additive manufacturing processes employing extrusion. For example, crosslinked polymers are completely unworkable once they have been crosslinked, and polymer precursors suitable for forming crosslinked polymers may not by themselves afford form factors suitable for being printed in fused filament fabrication and similar printing processes. Moreover, the piezoelectricity of polyvinylidene fluoride is rather low compared to other types of piezoelectric materials. These shortcomings may limit the range of printed parts having a piezoelectric response that may be obtained through present additive manufacturing processes.

Numerous ceramic materials having high piezoelectricity are available, such as lead-zirconium-titanate (PZT), but they are not printable by themselves and are often very brittle. Moreover, high sintering temperatures (>300° C.) may be needed to promote part consolidation and piezoelectric particle interconnectivity after depositing predominantly a piezoelectric ceramic. Admixtures of polymers and piezoelectric particles have not yet afforded high piezoelectric performance in printed parts. Poor dispersion of the piezoelectric particles in the polymer, particle agglomeration, and limited interactions between the piezoelectric particles and the polymer are to blame in many instances. Without being bound by any theory, the limited interactions between the piezoelectric particles and the polymer results in poor load transfer to the piezoelectric particles, thereby lowering the piezoelectric response obtained therefrom when mechanical strain is applied. Particle agglomeration may also play a role in this regard.

SUMMARY

In some embodiments, the present disclosure provides compositions comprising: a plurality of piezoelectric particles dispersed in at least a portion of a polymer material comprising at least one thermoplastic polymer and at least one thermally curable polymer precursor. Printed parts may comprise the compositions, optionally wherein the at least one thermally curable polymer precursor is in a covalently crosslinked form.

In some or other embodiments, the present disclosure provides compositions comprising: a plurality of piezoelectric particles dispersed in at least a portion of a polymer material comprising at least one thermoplastic polymer comprising a thermally curable functional group.

In still other embodiments, the present disclosure provides additive manufacturing processes comprising: providing a composition comprising: a plurality of piezoelectric particles dispersed in at least a portion of a polymer material comprising at least one thermoplastic polymer and at least one thermally curable polymer precursor, or a plurality of piezoelectric particles dispersed in at least a portion of a polymer material comprising at least one thermoplastic polymer comprising a thermally curable functional group; depositing the composition layer-by-layer to form a printed part; and heating while or after depositing the composition layer-by-layer to a temperature sufficient to react at least the at least one thermally curable polymer precursor or the thermally curable functional group to form an at least partially cured printed part.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and having the benefit of this disclosure.

DETAILED DESCRIPTION

Figure 1:
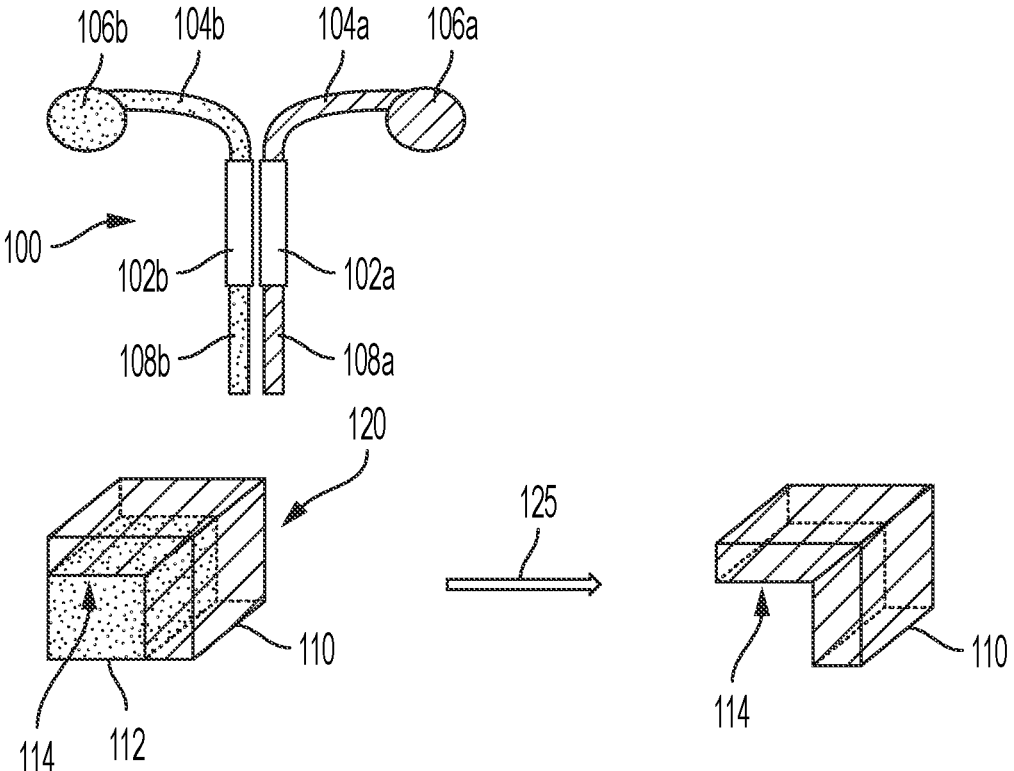
FIG. 1 shows a schematic of an illustrative fused filament fabrication process for producing a part using a build material and a removable support material.

The present disclosure generally relates to additive manufacturing, and more particularly, extrudable compositions suitable for additive manufacturing to form printed parts exhibiting piezoelectric properties. More specifically, the present disclosure provides compositions suitable for additive manufacturing in which piezoelectric particles are combined with a polymer material in a form factor suitable for additive manufacturing, and in which at least one component of the composition is cured in the course of forming a printed part. In various examples, curing may include reacting of the piezoelectric particles with themselves or at least one thermally curable polymer precursor or at least one thermoplastic polymer by thermal curing, reacting at least one thermally curable polymer precursor with itself or at least one thermoplastic polymer, reacting at least one thermoplastic polymer with itself by thermal curing, or any combination thereof. Particular examples may include printed parts in which at least one thermally curable polymer precursor is covalently crosslinked with itself and optionally with the piezoelectric particles. Covalent crosslinking between one or more components of the compositions may increase compatibility between the piezoelectric particles and the polymer material and enhance the piezoelectric response (piezoelectricity) obtained from printed parts formed therefrom following curing. The composites may have various form factors suitable for forming printed parts via extrusion such as, but not limited to, composite filaments, composite pellets, composite powders, and composite pastes, in which a covalently crosslinked polymer may become defined in the course of forming a printed part. Curing to form a covalently crosslinked polymer may take place after forming one or more printed layers and subsequent to deposition of additional printed layers, or curing may take place after formation of a printed part is complete.

As discussed above, additive manufacturing processes, such as fused filament fabrication, direct writing, or similar layer-by-layer deposition processes, are powerful tools for generating printed parts in a wide range of complex shapes. In many instances, the polymer materials used in layer-by-layer additive manufacturing processes are largely structural in nature and do not convey functional properties to a printed part by themselves. Polyvinylidene fluoride is a notable exception, which may form printed parts having piezoelectricity after suitable poling. Beyond polyvinylidene fluoride, there are few alternative polymer materials for introducing piezoelectricity to a printed part. Furthermore, the piezoelectricity of polyvinylidene fluoride may not be sufficiently large for some intended applications. Ceramic piezoelectric materials are not suitable by themselves for being directly printed in additive manufacturing processes.

In response to the foregoing shortcomings, the present disclosure provides compositions that are composites capable of undergoing extrusion to form printed parts through layer-by-layer additive manufacturing. The composites may have more robust mechanical properties than do the piezoelectric particles alone, at the least being less brittle and more flexible, and may be formed more readily into printed parts than can the piezoelectric particles alone. Moreover, the composites disclosed herein may incorporate functionality that is capable of undergoing curing after at least a portion of a printed part has been formed or while a printed part is being formed, thereby allowing at least partially cured printed parts having at least one cured (covalently crosslinked) component present therein to be realized after exposing the printed part to suitable curing conditions. In non-limiting examples, a polymer precursor and/or the piezoelectric particles may be covalently crosslinked with themselves and/or each other in the disclosure herein, thereby increasing the compatibility between the two and improving the piezoelectric response. As further indicated above, it is difficult to realize crosslinking within printed parts formed by extrusion-based additive manufacturing processes, since previously crosslinked polymers are not feasibly extruded. Crosslinkable polymer precursors by themselves sometimes are often very viscous and do not lead to readily extrudable form factors suitable for additive manufacturing, nor do they lead to self-supporting parts once printed. As described herein, the combination of at least one thermoplastic polymer, at least one polymer precursor that is thermally curable, and a plurality of piezoelectric particles may alleviate these difficulties.

The compositions described herein feature at least one component that is thermally curable. As used herein, the term "thermally curable" means that a reaction occurs upon exposing a component to a specified threshold temperature above which the component becomes reactive, optionally in the presence of a thermal initiator that generates free radicals thermally and promotes a reaction of a thermally curable component, preferably such that one or more covalent crosslinking reactions take place. The specified threshold temperature may be any temperature above room temperature (25° C.); however, the specified threshold temperature is preferably about 50° C. or higher, or about 60° C. or higher, or about 70° C. or higher, or about 80° C. or higher, or about 90° C. or higher, or about 100° C. or higher, such as about 80° C. to about 120° C. or about 100° C. to about 150° C., or about 120° C. to about 180° C., or about 150° C. to about 200° C. Temperatures within these ranges may be compatible with melt blending techniques for forming the composites disclosed herein. As will be appreciated by one having ordinary skill in the art, the specified threshold temperature at which a particular component becomes crosslinkable may vary based on several factors, such as molecular structure and/or a thermal initiator used. Some thermally initiated systems may be self-crosslinkable and function in the absence of a thermal initiator. In any event, the threshold temperature at which various components become reactive may either be well known or readily determined by a person having ordinary skill in the art.

Some configurations of the compositions described herein may feature at least one thermally curable polymer precursor, preferably present in combination with a plurality of piezoelectric particles that are also thermally curable. In addition to at least one thermally curable polymer precursor and the piezoelectric particles, the compositions disclosed herein further comprise at least one thermoplastic polymer as well. The at least one thermoplastic polymer may provide a matrix for blending the at least one thermally curable polymer precursor and the piezoelectric particles and afford a composition that is extrudable and self-supporting once printed. Following printing of the composites and curing of the at least one thermally curable polymer precursor and/or the piezoelectric particles, a covalently crosslinked polymer matrix containing the piezoelectric particles may be obtained, optionally with crosslinking of the piezoelectric particles to the crosslinked polymer matrix as well. The piezoelectric particles may be effectively localized within the crosslinked polymer matrix, thereby allowing their effective concentration in the printed part and the piezoelectric response to be increased. Moreover, covalent crosslinking between the piezoelectric particles and the covalently crosslinked polymer formed from the at least one thermally curable polymer precursor may also increase compatibility between the piezoelectric particles and the polymer material and enhance the piezoelectricity still further. Without being bound by any theory or mechanism, the covalent crosslinking is believed to enhance the piezoelectric effect by promoting load transfer from the covalently crosslinked polymer to the piezoelectric particles. Evidence of the improved compatibility between the covalently crosslinked polymer and the piezoelectric particles may include improved dispersion of the piezoelectric particles within the covalently crosslinked polymer material, as demonstrated by imaging, and/or enhancement of the piezoelectric response in comparison to that obtained with piezoelectric particles that are incapable of being cured. Alternately, the piezoelectric particles may be localized within the at least one thermoplastic polymer instead (or within a single thermoplastic polymer, if multiple thermoplastic polymers are present).

Also without being bound by theory or mechanism, the at least one thermoplastic polymer is believed to interpenetrate within the covalently crosslinked polymer matrix formed from the at least one thermally curable polymer precursor. The co-presence of the at least one thermoplastic polymer and the covalently crosslinked polymer with interpenetration therebetween may aid in increasing the flexibility of a printed part, which may be advantageous in certain situations. In addition, load transfer may be facilitated as well.

In other instances, the at least one thermoplastic polymer may be removed from a printed part by degradation or dissolution following curing to leave behind the covalently crosslinked polymer and piezoelectric particulates associated therewith. The resulting porosity within the printed part may be advantageous in some situations. Moreover, porosity generated within a printed part by degradation or dissolution of a thermoplastic polymer may be backfilled with one or more materials suitable for tailoring the mechanical properties or functionality of the printed part as well. Suitable materials for backfilling are provided hereinbelow.

In still another example, the at least one thermoplastic polymer itself may comprise a thermally curable functional group, which may allow an initially thermoplastic polymer to be converted into a covalently crosslinked polymer following printing and curing. A thermoplastic polymer containing a thermally curable functional group may be present in piezoelectric composites of the present disclosure by itself (in combination with suitable piezoelectric particles) or in combination with at least one thermally curable polymer precursor and/or piezoelectric particles that are thermally curable. Thus, the present disclosure affords considerable variability in the composition and form of printed parts obtained following extrusion and at least partial curing thereof.

Given a sufficient curing time, thermal curing may afford curing starting at the surface of a printed part and extending throughout the interior of the printed part. Curing may be stopped at any intermediate stage short of a full cure, depending on the length of time the printed part is heated. Photocuring, in contrast, usually is most effective within a thin layer near the surface of an object due to the limited depth to which electromagnetic waves may penetrate (unless photocuring takes place as a printed part is being formed). The extended covalently crosslinked polymer matrix resulting from thermal curing may afford robust mechanical properties and piezoelectricity throughout a printed part.

Suitable forms of the composites that may be processed by extrusion in the disclosure herein include composite filaments, composite pellets, composite powders, composite pastes, or any combination thereof. Additional details regarding these various form factors follows herein.

Advantageously, a range of polymer materials having functionality capable of undergoing thermal curing are commercially available or may be readily accessed by grafting or incorporation of a co-monomer capable of undergoing such curing. Various (meth)acrylate resins and similar substances having reactive carbon-carbon double bonds may be suitable in this regard. The term "resin" refers to a divalent polymerizable substance, either a monomer or oligeromer, that undergoes covalent crosslinking upon being cured. Particularly suitable examples of thermally curable polymer resins may include those that are capable of undergoing crosslinking in the presence of free radicals generated under thermal conditions, typically in the presence of a photoinitiator. Other types of thermally curable polymer precursors that may be suitable for use herein include, for example, epoxies, silicones, polyurethanes, phenolics, melamine formaldehyde resins, polyesters, urea formaldehyde resins, phenol formaldehyde resins, thioethers, thioesters, vinyl ester resins, cyanate ester resins, polybenzoxazines, polyimides, diallyl phthalate thermosets, furan resins, maleimide based thermosets, vulcanized rubbers and the like.

Similarly, piezoelectric particles may contain surface functional groups, such as surface hydroxyl groups, which may be readily functionalized with a thermally curable functional group, such as a (meth)acrylate group or similar moiety containing a reactive carbon-carbon double bond, to facilitate crosslinking thereof. The thermally curable group may be attached to the piezoelectric particles by a linker moiety covalently bonded to the particle surface.

Composite filaments and composite pellets containing a polymer material and/or piezoelectric particles that are thermally curable may be obtained by melt blending, provided that melt blending takes place at a temperature below which the thermally curable polymer precursor and/or the piezoelectric particles containing a thermally curable functional group become activated. Once extrusion has taken place to form a printed part, at least partial curing may take place by heating. Alternately, curing may take place simultaneously with printing. The at least one thermoplastic polymer may provide a suitable matrix for dispersion of the at least one thermally curable polymer precursor and/or the piezoelectric particles to afford a composite that may be further processed by extrusion and layer-by-layer deposition in the foregoing manner, such as through fused filament fabrication processes in the case of composite filaments, to afford significant piezoelectricity, after curing and poling of the printed part. Composite filaments that are suitable for fused filament fabrication may have diameters that are appropriate for the drive unit for a particular printing system (common filament diameters include 1.75 mm and 2.85 mm). Other properties that may determine if a composite filament is suitable for fused filament fabrication include the temperature required to extrude the filament, which should not be undesirably high and below a temperature at which curing takes place, unless curing takes place in conjunction with printing. A suitable composite filament for fused filament fabrication may further minimize printing issues, such as oozing from the print nozzle or clogging of the print nozzle, which may be impacted by the overall viscosity of the composite at the printing temperature. In addition, composite filaments suitable for fused filament fabrication may form parts that easily separate from a print bed, have sufficient mechanical strength once printed, and exhibit good interlayer adhesion. These characteristics may be enhanced by incorporating crosslinking within the printed parts in the manner described herein. Additional characteristics of suitable composite filaments and other form factors are specified below.

Composite filaments and other form factors obtained by melt blending may mix the piezoelectric particles with the polymer material, such as a substantially uniform dispersion of the piezoelectric particles in at least a portion of the polymer material. Suitable melt blending processes may include melt mixing with stirring, followed by extrusion of the resulting melt blend, or direct blending via extrusion with a twin-screw extruder. Surprisingly, such melt blending processes followed by further extrusion may afford a good distribution of the piezoelectric particles within the resulting composite and printed parts obtained therefrom. Cryo-milling, grinding or shredding before further extrusion of the composite may further facilitate the extrusion process and promote dispersion of the piezoelectric particles within the polymer material. Advantageously, the thermal curability of the composites is not impacted by these additional processing operations. Preferably, the melt blending processes may be conducted without the combination of the at least one thermoplastic polymer, the at least one thermally curable polymer precursor, and the piezoelectric particles ever being exposed to a solvent together, which may otherwise result in trace organic solvents remaining in the composites following extrusion in some instances, and undesirably become incorporated within a printed part. Moreover, melt blending with little to no void formation in the composites may be realized even in the absence of surfactants and other surface compatibilizers, which otherwise may be detrimental to include in a printed part. Further surprisingly and advantageously, little or no agglomeration of the piezoelectric particles within the polymer material may occur following melt blending, which may desirably improve the piezoelectric properties obtained after poling. A uniform dispersion of individual piezoelectric particles in the polymer material or a portion thereof may be realized in some instances, wherein the piezoelectric particles remain above a percolation threshold concentration within the polymer material. The piezoelectric particles may be considered above a percolation threshold concentration if the piezoelectric particles communicate with one another to generate a voltage when a mechanical load is being applied to the composites.

Advantageously, high loadings of the piezoelectric particles may be tolerated in the composites described herein, while still maintaining extrudability and affording printed parts having high structural integrity, particularly after curing, and with the piezoelectric particles remaining in a substantially non-agglomerated and dispersed state following printing. Distribution of the piezoelectric particles as individuals rather than as agglomerates may afford a significant increase in the piezoelectric response obtained after poling, since there may be a greater particle surface area to undergo interaction with the polymer material to promote load transfer in between. This effect may be further supplemented with one or more covalent interactions resulting from curing according to the disclosure herein.

Composite filaments compatible with fused filament fabrication may be formed in the disclosure herein. Although composite filaments may be an advantageous and particularly versatile form factor, it is to be realized that composite pellets may also be produced through melt blending and used in similar additive manufacturing processes. Namely, a thermoplastic polymer, at least one thermally curable polymer precursor, and piezoelectric particles may be combined with one another under melt blending conditions, and instead of extruding to form composite filaments, larger extrudates may be produced, which may then be cut, shredded, pulverized, or the like to afford composite pellets of a specified size and geometry, or composite powders having even smaller dimensions and a wide distribution of particle sizes. Other than having a different shape, the microscopic morphology of the composite pellets and composite powders may be similar to that of composite filaments. Like composite filaments, composite pellets and composite powders may be subsequently processed into printed parts having piezoelectric properties under suitable additive manufacturing conditions, wherein thermal curing within at least a portion of a printed part may take place following or during printing.

In the disclosure herein, "filaments" are to be distinguished from "fibers" on the basis that filaments comprise a single elongate form factor, whereas fibers comprise multiple filaments twisted together (bundled) to form a fine thread or wire in which the individual filaments remain identifiable. As such, filaments have smaller diameters than do fiber bundles formed therefrom, assuming no filament compression takes place when forming a fiber bundle. Filaments obtained by solution electrospinning or melt electrospinning are usually up to about 100 $\mu$m in diameter, which is too small to be effectively printed using fused filament fabrication. The composite filaments obtained by melt blending and extrusion in the disclosure herein, in contrast, may be about 0.5 mm or more in size and dimensioned for compatibility with a particular printing system for fused filament fabrication.

Another suitable form factor that may be produced in the disclosure herein is an extrudable composite paste. As used herein, the term "paste" refers to a composition that is at least partially fluid at a temperature of interest. The term "paste" does not necessarily imply an adhesive function of any type. Moreover, the terms "paste" and "ink" may be used interchangeably with one another in the disclosure herein with respect to direct writing additive manufacturing processes. Unlike composite filaments and composite pellets discussed in brief above, extrudable composite pastes may comprise at least one solvent to facilitate extrusion. The at least one solvent may or may not dissolve the polymer or a portion thereof. Optionally, suitable composite pastes may be at least biphasic and contain at least two immiscible fluid phases, wherein the piezoelectric particles and the polymer material are present in one or both of the at least two immiscible fluid phases. Localization of the piezoelectric particles in one phase (or at an interface between phases) may increase the piezoelectric response attainable therefrom. Phase localization prior to curing may also aid in promoting piezoelectric particle localization following curing and decreased loss of piezoelectric particles if the thermoplastic polymer is removed from the printed parts. The polymer material comprising at least one thermoplastic polymer and at least one thermally curable polymer precursor and the piezoelectric particles may be processed into a composite, such as through melt blending and decreasing particle size as discussed above, wherein particles of the pre-made composite are present in at least one phase of the extrudable composite paste. Alternately, a polymer material comprising at least one thermoplastic polymer and at least one thermally curable polymer precursor may be at least partially dissolved in at least one phase of an extrudable composite paste, and distribution of the piezoelectric particles within the polymer material may take place as the extrudable composite paste is extruded into a desired shape when forming and subsequently curing a printed part. As still another option, the at least one thermoplastic polymer and the photocurable polymer resin may be in separate phases of an extrudable composite paste, either of which may be admixed with the piezoelectric particles. Additional details regarding extrudable composite pastes are also provided hereinbelow.

Any of the foregoing form factors may afford printed parts that may have their piezoelectric properties enhanced by covalent crosslinking of the at least one thermally curable polymer precursor with the piezoelectric particles according to the disclosure herein. The resulting improvement in load transfer between the polymer material and the piezoelectric particles may improve the piezoelectric response, as well as increase mechanical strength of the printed parts. Advantageously, various types of piezoelectric particles may be functionalized with a group that may undergo covalent crosslinking with a complementary group within a polymer material under thermally promoted curing conditions. Likewise, a number of thermally curable polymer precursors are commercially available and may be incorporated within the compositions disclosed herein as well.

Figure 2:
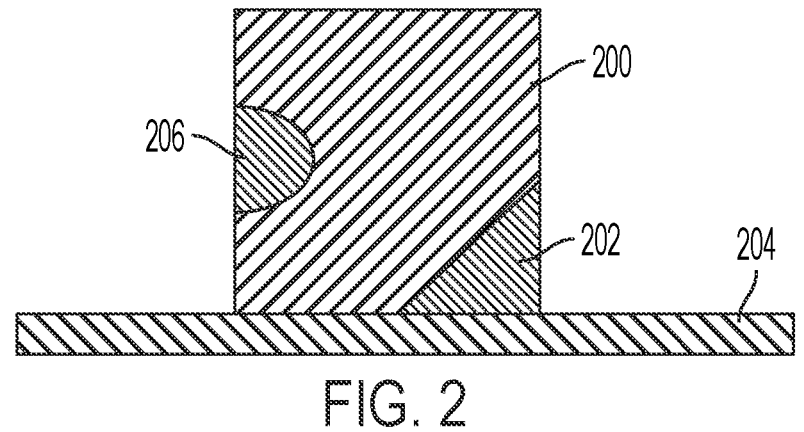
FIG. 2 shows a schematic of an illustrative part having a first removable support interposed between the part and a print bed and a second removable support interposed between two portions of the part.

Before addressing various aspects of the present disclosure in further detail, a brief discussion of additive manufacturing processes, particularly fused filament fabrication processes, parts will first be provided so that the features of the present disclosure can be better understood. FIG. 1 shows a schematic of an illustrative fused filament fabrication process for producing a part using a build material and a removable support material. As shown in FIG. 1, print head 100 includes first extruder 102a and second extruder 102b, which are each configured to receive a filamentous printing material. Specifically, first extruder 102a is configured to receive first filament 104a from first payout reel 106a and provide molten stream 108a of a first printing material, and second extruder 102b is configured to receive second filament 104b from second payout reel 106b and provide molten stream 108b of a second printing material. Both molten streams are initially deposited upon a print bed (not shown in FIG. 1) to promote layer-by-layer growth of supported part 120. The first printing material (build material) supplied by first extruder 102a may be a piezoelectric composite used to fabricate part 110, and the second printing material (removable support material) supplied by second extruder 102b may be a dissolvable or degradable polymer, which is used to fabricate removable support 112 under overhang 114. A dissolvable or degradable thermoplastic polymer may also be present within the first printing material supplied by first extruder 102a as well. Overhang 114 is not in direct contact with the print bed or a lower printed layer formed from the build material. Overhang 114 need not necessarily be present in a given printed part. In the part arrangement shown in FIG. 1, removable support 112 is interposed between overhang 114 and the print bed, but it is to be appreciated that in alternatively configured parts, removable support 114 may be interposed between two or more portions of part 110. FIG. 2, for example, shows illustrative part 200, in which removable support 202 is interposed between an overhang defined between part 200 and print bed 204, and removable support 206 is interposed between two portions of part 200.

Referring again to FIG. 1, once printing of part 110 and removable support 112 is complete, supported part 120 may be subjected to support removal conditions 125 that result in elimination of removable support 112 (e.g., dissolution or disintegration conditions, or the like) and leave part 110 with overhang 114 unsupported thereon. Support removal conditions 125 may include contact of supported part 120 with a solvent in which removable support 112 is dissolvable or degradable and part 110 is not. Curing of at least one component within the build material may take place after forming part 110. If removable support 112 is present, curing may take place before or after removal thereof.

If a printed part is being formed without an overhang or similar feature, it is not necessary to utilize a removable support material during fabrication of the printed part. Similarly, two or more different build materials may be utilized as well, such as when one or more of the build materials is structural in nature and one or more of the build materials is functional in nature. In non-limiting examples, a structural polymer may be concurrently printed with a piezoelectric composite of the present disclosure. Further disclosure directed to such piezoelectric composites is provided herein.

Compositions of the present disclosure may comprise a plurality of piezoelectric particles and a polymer material, wherein at least one component within the composition is thermally curable with itself or with at least one other component of the composition. In some embodiments, compositions of the present disclosure may comprise a plurality of piezoelectric particles and a polymer material comprising at least one thermoplastic polymer and at least one thermally curable polymer precursor, such as a thermally curable polymer resin. Enhancement of the piezoelectric response may be realized even when just the thermally curable polymer precursor is cured to form a printed part comprising a covalently crosslinked polymer. Preferably, the piezoelectric particles may be thermally curable as well, such that the piezoelectric particles may be covalently crosslinked in a printed part, either with themselves and/or the crosslinked polymer resulting from the thermally curable polymer precursor. Optionally, the at least one thermoplastic polymer may comprise at least one thermoplastic polymer comprising a thermally curable functional group as well. When the at least one thermoplastic polymer comprises a thermally curable functional group, alternative embodiments of the compositions may include those in which the at least one thermally curable polymer precursor is not present in combination with the piezoelectric particles and the at least one thermoplastic polymer. Such compositions may undergo crosslinking in a printed part in a similar manner to that described herein for the thermally curable polymer precursor.

The compositions disclosed herein are extrudable and maintain the ability to form self-standing three-dimensional structures once extruded during an additive manufacturing process. The term "self-standing" means that a printed part holds its shape and/or exhibits a yield stress once the composition has been extruded into a desired shape. In contrast, compositions that do not hold their shape following extrusion are referred to as "conformal," since they may assume the profile of the surface upon which they are deposited. In many instances, the ability for a composite to be extruded and the ability for the composite to provide a self-standing structure following extrusion are mutually exclusive features. For example, a composite that is extrudable may lack sufficient mechanical strength to support itself upon being deposited in a desired shape, and a composite that hold its shape within a three-dimensional structure may be too rigid to be extruded. The composites described herein may further be processed into various form factors capable of undergoing continuous extrusion.

The term "extrusion" and various grammatical forms thereof refers to the ability of a fluid to be dispensed through a small nozzle. In addition to producing self-standing structures, the composites disclosed herein may be formulated to maintain extrudability once they are heated at or above a melting point or softening temperature of a thermoplastic polymer therein. Both the thermoplastic polymer and the piezoelectric particles, as well as amounts thereof, may be selected to convey extrudability to the composites described herein. Composite pastes containing a thermoplastic polymer need not necessarily be heated at or above the melting point or softening temperature to facilitate extrusion, since such compositions are already at least partially in a fluid form. Once the composites of the present disclosure have been extruded into a desired shape, the shape may be maintained as consolidation of the thermoplastic polymer(s) occurs.

Accordingly, in some embodiments, compositions of the present disclosure may comprise: a plurality of piezoelectric particles dispersed in at least a portion of a polymer material comprising at least one thermoplastic polymer and at least one thermally curable polymer precursor. In other embodiments, compositions of the present disclosure may comprise a plurality of piezoelectric particles dispersed in at least a portion of a polymer material comprising at least one thermoplastic polymer comprising a thermally curable functional group.

As used herein, the term "polymer precursor" refers to a polymerizable substance and may be used synonymously with the terms "oligomer" and "monomer." Preferably, the polymer precursor may comprise at least one resin. Polymer precursors therefore may encompass a single polymerizable monomer unit containing at least one thermally curable functional group, preferably two or more thermally curable functional groups, or a polymerized form of the monomers containing only a few polymerized monomer units (e.g., about 5 or less, or about 10 or less), again with at least one thermally curable functional group being present, and preferably two or more thermally curable functional groups being present. Suitable thermally curable functional groups may include reactive carbon-carbon double bonds, such as at least one (meth)acrylate compound. As used herein, the term "(meth)acrylate" refers to a compound derived from acrylic acid or methacrylic acid, in which a reactive carbon-carbon double bond is attached to the carbon atom adjacent to the acid derivative carbonyl group. Other types of thermally curable polymer precursors may include, for example, epoxies, silicones, polyurethanes, phenolics, melamine formaldehyde resins, polyesters, urea formaldehyde resins, phenol formaldehyde resins, thioethers, thioesters, vinyl ester resins, cyanate ester resins, polybenzoxazines, polyimides, diallyl phthalate thermosets, furan resins, maleimide based thermosets, vulcanized rubbers and the like.

Suitable thermally curable polymer precursors containing a (meth)acrylate moiety to promote curing include, for example, (meth)acrylated epoxy monomers or oligomers, (meth)acrylated ester monomers or oligomers, (meth)acrylated urethane monomers or oligomers, (meth)acrylated silicones, aminated (meth)acrylate monomers or oligomers, halogenated (meth)acrylate monomers or oligomers, aryl (meth)acrylates monomers or oligomers, aliphatic (meth) acrylates (including aliphatic ring (meth)acrylates), (meth) acrylated ethers, the like, and any combination thereof.

Another class of suitable thermally curable polymer precursors may include various epoxies, which may be one-component or two-component epoxies in various examples. General classes of epoxies include pure epoxies, epoxy acrylates, and polyester epoxies. Epoxies comprise a resin component (Component A) and a curing agent (Component B), which may be located within a single compound in a one-component epoxy. The resin component may comprise at least one epoxide functional group. Resins containing epoxide functional groups may include, for example, bisphenol A resins, cycloaliphatic resins, trifunctional or tetrafunctional epoxides, novolac-type resins, halogenated resins, fluorinated resins, bio-based epoxide resins, phosphorus-containing resins, silicon-containing resins, and the like. Common curing agents may include primary and secondary amines, alkaline substances (e.g., imidazoles and tertiary amines), anhydrides, and catalytic curing agents (e.g., benzylsulfonium salts, benzylpyridinium salts, benzylammonium salts, and phosphonium salts). More specific examples of suitable resins components and curing agents will be familiar to one having ordinary skill in the art.

In addition to one or more components of the composites disclosed herein being covalently crosslinkable to each other through thermal curing, piezoelectric particles may further interact non-covalently with the at least one thermoplastic polymer and/or the polymer resulting from curing of the at least one thermally curable polymer precursor. More specifically, the piezoelectric particles utilized herein may further non-covalently interact with the at least one thermoplastic polymer and/or the polymer resulting from curing of the at least one thermally curable polymer precursor via π-π bonding, hydrogen bonding, electrostatic interactions stronger than van der Waals interactions, or any combination thereof. The piezoelectric particles and/or the at least one thermoplastic polymer and/or the at least one thermally curable polymer precursor may incorporate suitable functionality that may facilitate these types of non-covalent interactions.

Non-covalent interactions resulting from π-π bonding may arise when two aromatic groups interact with each other. That is, to produce a π-π noncovalent interaction between the piezoelectric particles and a polymer material, both the piezoelectric particles and the polymer material contain an aromatic group. Non-covalent interactions by π-π bonding can occur when the delocalized π-electron clouds of aromatic ring systems interact interfacially with one another, preferably extended aromatic ring systems containing two or more fused aromatic rings. The aromatic group upon the piezoelectric particles may be directly attached to the surface of the particle or be appended by a linker moiety covalently attached to the surface of the particle. Linker moieties suitable for attaching an aromatic group to piezoelectric particles may include, for example, silane-terminated or thiol-terminated linker moieties. Similar linker moieties may be utilized to introduce a thermally curable functional group to piezoelectric particles as well, preferably at least one (meth)acrylate group or an epoxide group. Illustrative silane functionalities that can form a covalent bond with surface hydroxyl groups of piezoelectric particles may include, for example, alkoxysilanes, dialkoxysilanes, trialkoxysilanes, alkyldialkoxysilanes, dialkylalkoxysilanes, aryloxysilanes, diaryloxysilanes, triaryloxysilanes, silanols, disilanols, trisilanols, and any combination thereof. Other types of groups that may bond covalently to the surface of piezoelectric particles for introducing various functionalities thereon include, for example, phosphines, phosphine oxides, phosphonic acids, phosphonyl esters, carboxylic acids, alcohols, and amines. Similarly, if not already present in a given type of polymer material, a co-monomer containing an aromatic group may be copolymerized with one or more non-aromatic monomers to produce a thermoplastic polymer suitable for use in the disclosure herein. Grafting of an aromatic group onto the backbone of a polymer material may also be conducted in some instances. Aromatic groups suitable for promoting non-covalent interactions between piezoelectric particles and a polymer material may include, for example, phenyl, naphthalenyl, anthracenyl, phenanthrenyl, pyrenyl, benz(a)anthracenyl, tetracenyl, benzo[a]pyrenyl, benzo[e]pyrenyl, benzo(g,h,i)perylenyl, chrysenyl, and dibenz(a,h)anthracenyl.

Non-covalent interactions resulting from hydrogen bonding may arise when a hydrogen bond donor and a hydrogen bond acceptor interact with each other. The hydrogen bond donor is located upon one of the piezoelectric particles and the polymer material and the hydrogen bond acceptor is located upon the other of the piezoelectric particles and the polymer material. Hydrogen bond donors may include, for example, hydroxyl groups, amine groups, carboxylic acid groups, and the like. Hydrogen bond acceptors may include any oxygen atom or oxygen-containing functional group, any nitrogen atom or nitrogen-containing functional group, or a fluorine atom. If not already present upon the piezoelectric particles or the polymer material, such hydrogen bond donors or hydrogen bond acceptors may be introduced by one having ordinary skill in the art. Optionally, hydrogen bond donors or hydrogen bond acceptors may be introduced onto piezoelectric particles through a linker moiety using similar attachment chemistries to those discussed above.

Non-covalent interactions resulting from electrostatic interactions may arise when a piezoelectric particle and a polymer material having opposite charges interact with each other (charge pairing or charge-charge interactions), including induced charge interactions in a dipole. Positively charged groups that may be present within either the piezoelectric particles or the polymer material may include, for example, protonated amines and quaternary ammonium groups. Negatively charged groups that may be present within either the piezoelectric particles or the polymer material may include, for example, carboxylates, sulfates, sulfonates, and the like. Like other types of non-covalent interactions, suitable groups capable of charge pairing may be introduced upon piezoelectric particles or a polymer material by one having ordinary skill in the art, including through attachment of a linker moiety to the piezoelectric particles. Other types of suitable electrostatic interactions may include, for example, charge-dipole, dipole-dipole, induced dipole-dipole, charge-induced dipole, and the like.

The compositions described herein may further comprise at least one thermal initiator. The at least one thermal initiator may promote curing upon exposure to a sufficient threshold temperature for forming a reactive intermediate within at least the thermally curable polymer precursor. Thermal initiators suitable for use in the disclosure herein in conjunction with polymer precursors containing a reactive carbon-carbon double bond are not believed to be particularly limited and may include any substance capable of forming free radicals thermally upon exposure to a sufficient temperature. Example thermal initiators may include, but are not limited to, 2,5-di(t-butylperoxy)-2,5-dimethyl-3-hexyne and other peroxide or hydroperoxide compounds, azo compounds, or any combination thereof. Other examples of suitable thermal initiators will be familiar to one having ordinary skill in the art and may include, for instance, 2,3-dimethyl-2,3-diphenylbutane, t-butyl hydroperoxide, 2,3-dimethyl-2,3-diphenylbutane, t-butyl hydroperoxide, t-amyl hydroperoxide, cumyl hydroperoxide, 1,1,3,3-tetramethylbutyl hydroperoxide, isopropylcumyl hydroperoxide, isopropylcumyl hydroperoxide, 2,5-dimethyl-2,5-di(tert-butylperoxy)-3-hexyne, 3,6,9-triethyl-3,6,9-trimethyl-1,4,7-triperoxonane, di(t-butyl)peroxide, 2,5-dimethyl-2,5-di(t-butylperoxy)hexane, di(tert-butylperoxy-isopropyl)benzene, t-butyl cumyl peroxide, di-(t-amyl)-peroxide, dicumyl peroxide, butyl 4,4-di(tert-butylperoxy)valerate, t-butylperoxybenzoate, 2,2-di(t-butylperoxy)butane, t-amyl peroxy-benzoate, t-butylperoxy-acetate, t-butylperoxy-(2-ethylhexyl)carbonate, t-butylperoxy isopropyl carbonate, t-butyl peroxy-3,5,5-trimethyl-hexanoate, 1,1-di(t-butylperoxy)cyclohexane, t-amyl peroxyacetate, and the like. Some examples of suitable thermal initiators may promote curing though mechanisms other than a free radical pathway.

The compositions described herein may be in various form factors. In particular, the polymer material and the piezoelectric particles may collectively define an extrudable material that is a composite having a form factor selected from the group consisting of composite filaments, composite pellets, composite powders, and composite pastes. The plurality of piezoelectric particles may be dispersed in at least a portion of the polymer material in any of these form factors, such as a substantially uniform dispersion of the piezoelectric particles in at least a portion of the polymer material, including the at least one thermally curable polymer precursor and/or the at least one thermoplastic polymer. Additional description of these form factors follows.

The polymer material or the piezoelectric particles may constitute a majority component of the composites disclosed herein. In non-limiting examples, the piezoelectric particles may comprise at least about 10 vol. %, or at least about 20 vol. %, or at least about 30 vol. %, or at least about 40 vol. %, or at least about 50 vol. %, or at least about 60 vol. %, or at least about 70 vol. %, or at least about 80 vol. %, or at least about 85 vol. %, or at least about 90 vol. %, or at least about 95 vol. % of the composites based on total volume. In more particular examples, the piezoelectric particles may comprise about 10 vol. % to about 85 vol. %, or about 25 vol. % to about 75 vol. %, or about 40 vol. % to about 60 vol. %, or about 50 vol. % to about 70 vol. % of the composites based on total volume. A minimum volume percentage may be selected such that satisfactory piezoelectric properties are realized. A maximum volume percentage of the piezoelectric particles may be chosen such that the composites maintain structural integrity and extrudability. For example, in the case of composite filaments, the amount of piezoelectric particles may be chosen to maintain structural integrity as a continuous filament and that also remains printable by fused filament fabrication. Preferably, the piezoelectric particles may be distributed within the polymer material in a composite under conditions at which the piezoelectric particles remain substantially dispersed as individuals without becoming significantly agglomerated with each other.

Composite filaments of the present disclosure may be suitable for use in fused filament fabrication and comprise at least one thermoplastic polymer, at least one thermally curable polymer precursor, and a plurality of piezoelectric particles. Alternately, composite filaments may comprise at least one thermoplastic polymer bearing a thermally curable functional group and a plurality of piezoelectric particles, which may undergo covalent crosslinking with each other once extruded to form a printed part or while forming a printed part. In non-limiting examples, the composite filaments may be formed by melt blending, preferably such that the piezoelectric particles remain in a substantially non-agglomerated form following formation of the composite filaments. In various embodiments, the piezoelectric particles may be no more agglomerated than an extent of particle agglomeration prior to melt blending. Melt blending conditions used for producing the composite filaments may be chosen such that substantially no covalent crosslinking occurs during the melt blending process.

Composite pellets having dispersed piezoelectric particles may similarly be obtained by melt blending, in non-limiting examples. Instead of being produced in an elongate form similar to composite filaments, composite pellets may be characterized by an aspect ratio of about 5 or less and particle sizes having dimensions ranging from about 100 microns to about 5 cm. Composite pellets may feature a loading of piezoelectric particles in the polymer material similar to that of composite filaments, and once printed and poled, they may provide a similar range of $d_{33}$ values. Similarly, the piezoelectric particles may remain in a substantially non-agglomerated form in the composite pellets produced according to the disclosure herein.

Composite powders may be obtained by grinding, milling, pulverizing, or similar processes to produce non-elongate particulates having an irregular shape and a particle size of about 10 microns to about 1 mm, or about 10 microns to about 500 microns, or about 10 microns to about 100 microns. The particle size distribution may be relatively wide when composite powders are produced by grinding or similar processes, but the particle size distribution may be narrowed by sieving or a similar size sorting technique, if desired.

Extrudable composite pastes may comprise a plurality of piezoelectric particles, a polymer material comprising at least one thermoplastic polymer and/or at least one thermally curable polymer precursor, and a sufficient amount of at least one solvent to promote extrusion at a temperature of interest. The solvent may be optional in some instances. For example, the at least one thermally curable polymer precursor may serve as a surrogate to the solvent in some instances. The extrudable composite pastes may be monophasic, biphasic, or triphasic. When biphasic or higher, the piezoelectric particles and the polymer material may be present in one or both of the at least two immiscible phases. The polymer material and the piezoelectric particles may be processed into a composite, such as through melt blending and decreasing particle size as discussed above, wherein particles of the pre-made composite are present in at least one phase of the extrudable composite paste. Alternately, a polymer material may be at least partially dissolved in at least one phase of an extrudable composite paste, and dispersion of the piezoelectric particles within at least a portion of the polymer material may take place as the extrudable composite paste is extruded into a desired shape when forming a printed part. For example, the piezoelectric particles may become dispersed in the polymer material as the at least one solvent evaporates during printing of the extrudable composite pastes. The at least one thermoplastic polymer and the at least one thermally curable polymer precursor may be present in different phases of the extrudable composite pastes, such that the piezoelectric particles may be better localized in a portion of the polymer material when covalent crosslinking takes place following printing.

Optionally, the extrudable composite pastes may comprise a sol-gel material. When present, the sol-gel material may be included in an amount ranging from about 10 wt. % to about 20 wt. %, based on a combined mass of the extrudable composite paste. Inclusion of a sol-gel may result in a stiff matrix following curing thereof, which may enhance the piezoelectric response obtained from the piezoelectric particles. The stiff matrix resulting from the sol-gel may be present in a printed part in addition to the crosslinked polymers disclosed herein.

Suitable solvents that may be present in the extrudable composite pastes may include high-boiling solvents such as, but not limited to, 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, glycerol, 2-(2-methoxyethoxy)acetic acid or any combination thereof. Other high-boiling solvents having a boiling point in the range of about 100° C. to about 300° C. may be used as well. Suitable amounts of the at least one solvent may range from about 3 wt. % to about 35 wt. %, based on total mass of the extrudable composite pastes.

In some embodiments, the extrudable composite pastes may be biphasic, in which case the at least one solvent may comprise water and a water-immiscible solvent. In non-limiting examples, an aqueous phase may comprise the water, a water-soluble polymer, and the piezoelectric particles, and an immiscible organic phase may comprise a non-water soluble polymer material and an optional organic solvent. The at least one thermoplastic polymer may be either water-soluble or water-insoluble and be present in either phase, as may the at least one thermally curable polymer precursor. When present, a sol-gel material may be present in the aqueous phase. The water-soluble polymer and the non-water soluble polymer material may be distributed co-continuously with one another, as described in more detail below.

The extrudable composite pastes may exhibit shear-thinning behavior, such that they may be readily extruded but quickly assume a fixed shape having a yield stress of about 100 Pa or greater upon being printed. In non-limiting examples, the extrudable composite pastes may have a viscosity of about 15,000 cP to about 200,000 cP when being sheared at a rate of about 5-10 s$^{-1}$.

When processed as a suitable form factor, printed parts having good piezoelectric performance may be obtained following printing and at least partial curing. Printing may initially take place to form a printed part that is substantially uncured (i.e., a printed part precursor), which is then at least partially cured within a portion or the entirety of the printed part to form a covalently crosslinked polymer. The piezoelectric response may increase upon curing, particularly when the piezoelectric particles are thermally curable as well. More particularly, the composites of the present disclosure may be capable of being printed as a single-layer thin film having a $d_{33}$ value, after poling, of about 1 pC/N or more at a film thickness of about 200 microns, as measured using an APC International Wide-Range $d_{33}$ meter. Thin film thicknesses are measured using standard techniques separately from the $d_{33}$ measurements. In more particular examples, the composites may be capable of forming single-layer thin films having a $d_{33}$ value, after poling, of about 1 pC/N to about 400 pC/N, or about 2 pC/N to about 200 pC/N, or about 3 pC/N to about 100 pC/N, or about 1 pC/N to about 75 pC/N, or about 5 pC/N to about 50 pC/N, or about 1 pC/N to about 10 pC/N, or about 2 pC/N to about 8 pC/N, or about 3 pC/N to about 10 pC/N, or about 1 pC/N to about 5 pC/N, or about 4 pC/N to about 7 pC/N under these conditions. The loading of piezoelectric particles and suitable blending conditions to maintain the piezoelectric particles as individuals once distributed within the polymer material may be selected to afford a desired extent of piezoelectricity. Single-layer film thicknesses that may be printable with the composites may range from about 10 μm to about 500 μm in thickness or about 25 μm to about 400 μm in thickness.

In order to display observable piezoelectric properties, a material such as a printed part or thin film, may be poled. Poling involves subjecting a material to a very high electric field so that dipoles of a piezoelectric material orient themselves to align in the direction of the applied field. Suitable poling conditions will be familiar to one having ordinary skill in the art. In non-limiting examples, poling may be conducted by corona poling, electrode poling or any combination thereof. In corona poling, a piezoelectric material is subjected to a corona discharge in which charged ions are generated and collect on a surface. An electric field is generated between the charged ions on the surface of a material and a grounded plane on the other side of the material. The grounded plane may be directly adhered to the material or present as a grounded plate. In electrode poling (contact poling), two electrodes are placed on either side of a piezoelectric material, and the material is subjected to a high electric field generated between the two electrodes.

Although poling may be conducted as a separate step, as described above, poling may also be conducted in concert with an additive manufacturing process. In non-limiting examples, a high voltage may be applied between an extrusion nozzle supplying molten composite (formed from the composite filaments or composite pellets disclosed herein) and a grounded plane onto which the molten composite is being deposited to form a printed part. Optionally, poling may also take place in conjunction with curing of a printed part as well.

Suitable piezoelectric particles for use in the present disclosure are not believed to be particularly limited, provided that the piezoelectric particles may be adequately blended with the polymer material, preferably remaining as individuals once blending with the polymer material has taken place. In the disclosure herein, the piezoelectric particles may be covalently crosslinked (e.g., through curing of at least one thermally curable functional group) and/or interact non-covalently in at least one manner with the polymer material in order to realize enhancement of the piezoelectric response. Suitable non-covalent interactions may include one or more of π-π bonding, hydrogen bonding, electrostatic interactions stronger than van der Waals interactions, or any combination thereof. The polymer material and/or the piezoelectric particles may be selected to promote thermal curing or one or more of these non-covalent interactions, or the piezoelectric particles may be further functionalized to promote thermal curing or a desired non-covalent interaction with a specified polymer material. For example, surface hydroxyl groups upon piezoelectric particles may be functionalized with a silane moiety having at least one thermally curable functional group appended thereto. Other types of functionalization strategies for introducing a thermally curable functional group upon piezoelectric particles may be envisioned by one having ordinary skill in the art. Suitable thermally curable functional groups may include activated carbon-carbon double bonds, such as (meth)acrylate moieties and derivatives thereof, or epoxide groups. Other types of thermally curable functional groups may also be suitable for implementation in the disclosure herein.

Optionally, the piezoelectric particles may additionally be covalently bonded to the polymer material other than through curing to form a covalently crosslinked matrix. Covalent bonding may take place between surface functional groups present upon the piezoelectric particles, such as surface hydroxyl groups, and the polymer material, or the surface functional groups may be further functionalized with a moiety bearing a functional group capable of reacting with the polymer material under specified conditions. Various strategies for promoting covalent bond formation may be contemplated by persons having ordinary skill in the art. When present, covalent bonding between the piezoelectric particles and the polymer material may also promote dispersion of the piezoelectric particles and enhancement of the piezoelectric properties in a manner related to that promoted by thermal curing.

Illustrative examples of piezoelectric materials that may be present in piezoelectric particles suitable for use herein include, but are not limited to, crystalline and non-crystalline ceramics, and naturally occurring piezoelectric materials. Suitable crystalline ceramics exhibiting piezoelectric properties may include, but are not limited to, lead zirconate titanate (PZT), potassium niobate, sodium tungstate, $Ba_2NaNb_5O_5$, and $Pb_2KNb_5O_{15}$. Suitable non-crystalline ceramics exhibiting piezoelectric properties may include, but are not limited to, sodium potassium niobate, bismuth ferrite, sodium niobate, barium titanate, bismuth titanate, and sodium bismuth titanate. Particularly suitable examples of piezoelectric particles for use in the disclosure herein may include those containing, for instance, lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof. Suitable dopants for lead zirconate titanate may include, but are not limited to Ni, Bi, La, and Nd.

Other suitable piezoelectric particles may include naturally occurring piezoelectric materials such as, for example, quartz crystals, cane sugar, Rochelle salt, topaz, tourmaline, bone, or any combination thereof. Still other examples of piezoelectric materials that may be used include, for example, ZnO, $BiFeO_3$, and $Bi_4Ti_3O_{12}$.

The piezoelectric particles employed in the disclosure herein may have an average particle size in a micrometer or nanometer size range. In more particular examples, suitable piezoelectric particles may have a diameter of about 25 microns or less, or about 10 microns or less, such as about 1 micron to about 10 microns, or about 2 microns to about 8 microns. Smaller piezoelectric particles, such as those having an average particle size under 100 nm or an average particle size of about 100 nm to about 500 nm or about 500 nm to about 1 micron may also be utilized in the disclosure herein. Average particle sizes in the disclosure herein represent $D_{50}$ values, which refers to a diameter at which 50% of the sample (on a volume basis unless otherwise specified)

is comprised of particles having a diameter less than said diameter. $D_{50}$ may also be referred to as the "average particle size." Such average particle size measurements may be made by analysis of optical images, including via SEM analysis, or using onboard software of a Malvern Mastersizer 3000 Aero S instrument, which uses light scattering techniques for particle size measurement.

Agglomeration refers to an assembly comprising a plurality of particulates that are loosely held together through physical bonding forces. Agglomerates may be broken apart through input of energy, such as through applying ultrasonic energy, to break the physical bonds. Homogenization may also be used to promote de-agglomeration. Individual piezoelectric particles that have been produced through de-agglomeration may remain de-agglomerated once blending with a polymer material has taken place. That is, defined agglomerates are not believed to re-form during the blending processes with a polymer material as disclosed herein. Similarly, the piezoelectric particles may remain de-agglomerated when forming and at least partially curing a printed part. It is to be appreciated that two or more piezoelectric particles may be in contact with one another in a piezoelectric composite or printed part, but the extent of interaction is less than that occurring in an agglomerate of piezoelectric particulates. In non-limiting examples, agglomerates of piezoelectric particles may have a size ranging from about 100 microns to about 200 microns, and individual piezoelectric particles obtained after de-agglomeration may be in a size range of about 1 micron to about 5 microns or about 1 micron to about 10 microns, or any other size range disclosed above. The de-agglomerated piezoelectric particle sizes may be maintained following formation of a form factor of the present disclosure.

Thermoplastic polymers suitable for use in the disclosure herein are not believed to be particularly limited, other than allowing piezoelectric particles to be sufficiently distributed therein in form factors that may be dispensed by extrusion. Optionally, suitable thermoplastic polymers may include at least one thermally curable functional group as well, thereby allowing the thermoplastic polymers to undergo crosslinking and at least partial conversion into a crosslinked polymer in some embodiments of the present disclosure. As still another further option, suitable thermoplastic polymers may be a homopolymer or co-polymer containing functionality suitable to interact non-covalently with surface functionality upon piezoelectric particles or one or more functional groups appended to the surface of piezoelectric particles. In the case of π-π bonding, for example, the piezoelectric particles and the thermoplastic polymer or copolymer may each contain at least one aryl group, such that the aryl groups in both locations interact with one another by π-π stacking interactions. In the case of hydrogen bonding, one of the piezoelectric particles and the thermoplastic polymer may contain a hydrogen bond donor and the other of the piezoelectric particles and the thermoplastic polymer may contain a hydrogen bond acceptor. For example, one of the piezoelectric particles and the thermoplastic polymer may contain hydroxyl or amine groups that may function as hydrogen bond donors, and the other of the piezoelectric particles and the thermoplastic polymer may contain an oxygen, nitrogen or fluorine atom that accepts a hydrogen bond from the hydrogen bond donor. In the case of electrostatic interactions, the piezoelectric particles and the thermoplastic polymer may contain oppositely charged functional groups, such that electrostatic charge pairing (ionic bonding) occurs between the two. For example, one of the piezoelectric particles and the thermoplastic polymer may contain a protonated amine or quaternary ammonium group, and the other of the piezoelectric particles and the thermoplastic polymer may contain a deprotonated carboxylic acid or sulfonic acid. Other types of suitable electrostatic interactions may include, for example, charge-dipole, dipole-dipole, induced dipole-dipole, charge-induced dipole, and the like. Groups capable of π-π bonding, hydrogen bonding, electrostatic interactions, or any combination thereof may be present in the thermally curable polymer precursor as well.

In addition to facilitating distribution of the piezoelectric particles and optionally being capable of interacting in some manner with the piezoelectric particles, the thermoplastic polymer may exhibit a melting point or softening temperature compatible with extrusion. In non-limiting examples, suitable thermoplastic polymers may exhibit a softening temperature or melting point sufficient to facilitate deposition at a temperature ranging from about 50° C. to about 400° C., or about 70° C. to about 275° C., or from about 100° C. to about 200° C., or from about 175° C. to about 250° C. Melting points may be determined using ASTM E794-06 (2018) with a 10° C. ramping and cooling rate, and softening temperatures may be determined using ASTM D6090-17. Selection of a thermoplastic polymer with a suitable melting point or softening temperature may require further consideration of the temperature at which the thermally curable polymer precursor or the piezoelectric particles become activated to undergo curing.

Illustrative examples of suitable thermoplastic polymers may include those commonly employed in fused filament fabrication such as, for instance, a polyamide, a polycaprolactone, a polylactic acid, a poly(styrene-isoprene-styrene) (SIS), a poly(styrene-ethylene-butylene-styrene) (SEBS), a poly(styrene-butylene-styrene) (SBS), a high-impact polystyrene (HIPS), polystyrene, a thermoplastic polyurethane, a poly(acrylonitrile-butadiene-styrene) (ABS), a polymethylmethacrylate, a poly(vinylpyrrolidine-vinylacetate), a polyester (e.g., polyethylene terephthalate (PET), polyethylene naphthalate (PEN), polyethylene terephthalate glycol (PETG), and the like), a polycarbonate, a polyethersulfone, a polyoxymethylene, a polyether ether ketone, polyether aryl ketone, a polyetherimide, a polyethylene, a polyethylene oxide, a polyphenylene sulfide, a polypropylene, a polystyrene, a polyvinyl chloride, polyphenylene ethers (PPE), a poly(tetrafluoroethylene), a poly(vinylidene fluoride), a poly (vinylidene fluoride-hexafluoropropylene), any copolymer thereof, and any combination thereof. When needed for promoting a given type of interaction and not already present in a specified parent polymer (e.g., a thermally curable functional group and/or a functional group capable of undergoing at least one type of non-covalent interaction), a co-monomer may be included that contains a functional group capable of undergoing curing and/or facilitating at least one non-covalent interaction according to the disclosure herein, such as a co-monomer containing at least one (meth)acrylate group, aryl group, a hydrogen bond donor, a hydrogen bond acceptor, or a charged group. Other suitable thermoplastic polymers that may be present in the form factors disclosed herein include, for example, polylactic acid, polyvinylpyrrolidone-co-polyvinyl acetate (PVP-co-PVA), copolymers thereof, and the like. Some examples of the composites disclosed herein may include a suitable thermoplastic polymer that is itself non-piezoelectric. In particular examples, composites disclosed herein may comprise a thermoplastic polymer other than polyvinylidene fluoride.

In various examples, the at least one thermoplastic polymer and the at least one thermally curable polymer precursor may be present with respect to each other at a volume ratio ranging from about 100:1 to about 1:100, or about 25:1 to about 1:25, or about 10:1 to about 1:10, or about 5:1 to about 1:5, or about 2:1 to about 1:2.

In some embodiments, the polymer material within the composites may comprise a first polymer material and a second polymer material, wherein the first polymer material and the second polymer material are immiscible with each other prior to thermal curing. For example, the at least one thermoplastic polymer and the at least one thermally curable polymer precursor may be immiscible with one another. Following curing of the composite within a printed part, the resulting covalently crosslinked polymer and the at least one thermoplastic polymer may similarly exhibit phase separation, such that the at least one thermoplastic polymer inter-penetrates within a network of covalently crosslinked polymer, optionally being further covalently crosslinked to the piezoelectric particles. That is, the at least one thermally curable polymer precursor is polymerizable to a covalently crosslinked polymer that remains immiscible with the at least one thermoplastic polymer following thermal curing. In another example, the at least one thermoplastic polymer may comprise a mixture of thermoplastic polymers, wherein at least two of the thermoplastic polymers are immiscible with each other. The photocurable polymer precursor may be admixed with either, both, or neither of the at least two immiscible thermoplastic polymers. Similarly, the piezo-electric particles may be admixed with either or both of the at least two immiscible thermoplastic polymers.

A number of benefits and features may be realized by having a first polymer material and a second polymer material that are immiscible, either before or after curing. In some instances, the piezoelectric particles may be substantially admixed with one of the first polymer material or the second polymer material, thereby effectively increasing the local concentration of the piezoelectric particles in the composites. For example, the piezoelectric particles may be substantially localized in the at least one thermally curable polymer precursor, or a covalently crosslinked polymer resulting therefrom. In some or other embodiments, one of the first polymer material or the second polymer material may be dissolvable or degradable under specified conditions, whereas the other of the first polymer material and the second polymer material is not dissolvable or degradable. Optionally, non-polymeric materials that are dissolvable or degradable may be utilized to accomplish a similar result. For example, a thermoplastic polymer may be selected that dissolves or degrades under conditions in which the ther-mally curable polymer precursor, or a covalently crosslinked polymer resulting therefrom, is insoluble or non-degradable, thereby allowing the piezoelectric particles to be localized in a covalently crosslinked polymer resulting from curing of the thermally curable polymer precursor. Moreover, upon dissolving or degrading a thermoplastic polymer mixed with at least one covalently crosslinked polymer, a composite of the covalently crosslinked polymer and the piezoelectric particles having porosity defined therein may be realized. In another example, a first thermoplastic polymer may be removed by dissolution or degradation from a second ther-moplastic polymer that is non-dissolvable or non-degrad-able, thereby again defining porosity about the covalently crosslinked polymer while leaving the second thermoplastic polymer intact in a printed part. The piezoelectric particles may remain dispersed in the second thermoplastic polymer and/or the covalently crosslinking polymer following disso-lution or degradation of the first polymer material. Option-ally, the porosity may be at least partially backfilled with a material differing from the thermoplastic polymer that was removed by degradation or dissolution. If the first polymer material and the second polymer material are distributed co-continuously, as discussed further below, a porous com-posite having a plurality of interconnected pores about the covalently crosslinked polymer may be obtained. Alter-nately, a first polymer material and a second polymer material, in which neither polymer material is dissolvable or degradable, may be distributed co-continuously, optionally with piezoelectric particles substantially localized in one of the first polymer material or the second polymer material (or at an interface between the first polymer material and the second polymer material). Distribution of the piezoelectric particles within one of the first polymer material and the second polymer material may again allow the effective concentration of piezoelectric particles to be increased.

When porosity is introduced into a printed part in accor-dance with the disclosure above, the porosity may be back-filled with a material for further modifying the properties of the composite. In non-limiting examples, the porosity may by backfilled with electrically conductive particles includ-ing, but not limited to, high-conductivity metal particles such as silver, copper, aluminum, gold, and the like; and electrically conductive carbon materials such as carbon black, carbon fibers, graphene, carbon nanotubes, and the like. Illustrative forms for electrically conductive particles may include, for example, nanoparticles, nanoflakes, nanowires, nanorods, microflakes, and the like. Additional materials that may be used for backfilling include, for example, a polymer differing from the polymer material that was removed to generate the porosity, thermally conductive particles, reinforcement fibers, colorants, stabilizers, plasti-cizers, and the like. Such additives may be introduced in a liquid solution or dispersion, which is subsequently evapo-rated once backfilling has taken place. A low viscosity polymer or low-viscosity curable resin may also be utilized instead of a liquid solution or dispersion to promote back-filling with other materials.

Other suitable materials for backfilling may include, for example, nanocrystalline cellulose, cellulose nanofibrils, silica, silica-alumina, alumina such as (pseudo)boehmite, gibbsite, titania, zirconia, cationic clays or anionic clays such as saponite, bentonite, kaoline, sepiolite, hydrotalcite, and the like. Other suitable backfilling materials may also include metal oxides such as alumina trihydrate (ATH), alumina monohydrate, magnesium hydroxide, magnesium silicate, talc, silicas such as fumed silica and precipitated silica, and calcium carbonate, calcium metasilicate, Wollas-tonite, Dolomite, Perlite, hollow glass spheres, kaolin, and the like. UV stabilizers such as titanium oxide, zinc oxide, benzophenones, benzotriazoles, aryl esters, sterically hin-dered amines, the like, and any combination thereof may also be present.

Compositions of the present disclosure may comprise a continuous polymer phase comprising first and second poly-mer materials, such as first and second thermoplastic poly-mers, that are immiscible with one another, wherein one of the polymer materials is dissolvable or degradable and may be removed from the other polymer material under specified conditions, thereby introducing porosity to a printed part formed therefrom, wherein the printed part further com-prises a covalently crosslinked polymer arising from a thermally curable polymer precursor. Alternately, a thermo-plastic polymer and a thermally curable polymer precursor may be distributed co-continuously with one another, and the co-continuous distribution may be maintained following printing and curing of a printed part, in which a covalently crosslinked polymer and a thermoplastic polymer interpenetrate with one another. The term "continuous polymer phase" refers to the bulk phase in which the piezoelectric particles are dispersed in at least a portion of the polymer matrix. A continuous polymer phase may contain the first and second polymer materials distributed co-continuously or non-co-continuously within one another. In a co-continuous distribution of the first and second polymer materials, the first and second polymer materials may exist as separate, continuous polymer phases that are interblended with each other. That is, the first and second polymer materials may define an interpenetrating network of the polymer materials, wherein there is connectivity between at least a majority of the first polymer material and connectivity between at least a majority of the second polymer material throughout the continuous polymer phase. In a non-co-continuous distribution of the first and second polymer materials, in contrast, isolated pockets of one of the polymer materials may exist in a continuous matrix of the other. Thus, in a co-continuous distribution, any cross-section of the composite contains at least some of both the first polymer material and the second polymer material. Composites containing regions that are separately co-continuous or non-co-continuous also are within the scope of the present disclosure.

When two polymer materials are immiscible, removal of one of the polymer materials through selective dissolution or degradation may afford controlled porosity or channel introduction into a printed part, particularly after at least partial thermal curing has taken place. Very fine porosity features may be realized, much smaller than those that might be attainable through direct printing. In non-limiting examples, the at least one thermoplastic polymer may be a water-soluble thermoplastic polymer and the other polymer material may be a water-insoluble thermally curable polymer precursor. In other instances, one of the polymer materials, such as the at least one thermoplastic polymer, is dissolvable in an organic solvent and the other polymer material, such as the at least one thermally curable polymer precursor, is not soluble in the same organic solvent (but may be soluble in a different organic solvent). In still other instances, one of the polymer materials, such as the at least one thermoplastic polymer, may be degraded to byproducts that separate from the covalently crosslinked polymer resulting from the at least one thermally curable polymer precursor, wherein the degradation conditions do not substantially impact the covalently crosslinked polymer. Degradation by melting which removes one of the polymer materials from the other also resides within the scope of the present disclosure. By altering the ratio of immiscible polymer materials in the composite, the extent of porosity may be regulated to a desired degree.

It is to be appreciated that the first polymer material and the second polymer material need not necessarily comprise a single polymer material of each type. Thus, depending on application-specific needs, the first polymer material may comprise one or more thermoplastic polymers, such as two or more thermoplastic polymers that are dissolvable or degradable under specified conditions, and the second polymer material may comprise one or more thermally curable polymer precursors. In still other examples, the first polymer material and the second polymer material may comprise two or more different thermoplastic polymers that undergo dissolution or degradation under different conditions from one another.

Advantageously, when immiscible polymer materials are present and one of the polymer materials is removed, piezoelectric particles may remain substantially associated with or localized in the polymer material that remains undissolved or non-degraded, or a crosslinked form thereof, thus experiencing minimal loss when the dissolvable or degradable polymer material is removed (e.g., through exposure to an appropriate solvent or other conditions that may promote removal of one or more thermoplastic polymers in preference to another). For example, the piezoelectric particles may remain associated with the covalently crosslinked polymer following crosslinking. Accordingly, a porous network of the piezoelectric particles distributed in the covalently crosslinked polymer may be realized after printing, curing, and further processing according to the disclosure herein. The piezoelectric particles may be uniformly distributed in the covalently crosslinked polymer and have a higher effective concentration therein than in the as-produced composite. Alternately, piezoelectric particles may be dispersed in a thermoplastic polymer that is not removed and remains associated with the covalently crosslinked polymer. The piezoelectric particles may be localized in the thermoplastic polymer that is not removed through native compatibility of the piezoelectric particles with the thermoplastic polymer, or compatibility may be enhanced by introducing non-covalent interactions and/or covalent bonding to the thermoplastic polymer. Piezoelectric particles that are covalently bonded to the thermoplastic polymer may still become covalently crosslinked to the thermally curable polymer precursor as well, thereby linking the thermoplastic polymer and the covalently crosslinked polymer via the piezoelectric particles.

Advantageously, composites capable of forming printed parts containing piezoelectric particles distributed in a crosslinked polymer may be formulated, at least in part, using a room temperature aqueous-based process employing a water-soluble thermoplastic polymer and a thermally curable polymer precursor. Polyvinyl alcohol (PVA), polyethylene glycol (PEG, also known as polyethylene oxide), or any combination thereof may be combined with piezoelectric particles in an aqueous phase containing a thermally curable polymer precursor that is suspended in the aqueous phase and with which the water-soluble thermoplastic polymer is immiscible. After removal of the water from the combined aqueous phase, the two polymer materials may form a continuous polymer phase, in which the two polymer materials remain mutually immiscible with one another, and in which the piezoelectric particles are distributed throughout the continuous polymer phase but are substantially localized in the thermally curable polymer precursor. Following curing and removal of the water-soluble thermoplastic polymer, the piezoelectric particles may remain substantially associated with the crosslinked polymer, thereby resulting in minimal loss of piezoelectric particles with the water-soluble thermoplastic polymer. In one example, the continuous polymer phase containing the piezoelectric particles may be obtained as a cast film before being processed into a pre-cured form factor of a composite, such as those specified above, wherein the piezoelectric particles are substantially localized within the thermally curable polymer precursor. Therefore, once formed into a printed part and curing takes place, the thermoplastic polymer may be removed to afford a porous polymer network comprising the covalently crosslinked polymer but without releasing substantial quantities of the piezoelectric particles.

In some examples, the first polymer material may be a water-soluble or degradable thermoplastic polymer and the second polymer material may be a water-insoluble or non-degradable thermoplastic polymer, which may be present in combination with at least one thermally curable polymer precursor. In other instances, a water-soluble thermoplastic polymer may be present in combination with a thermally curable polymer precursor without a second thermoplastic polymer being present, while still being removable following covalent crosslinking. Examples of water-soluble thermoplastic polymers suitable for use in the disclosure herein may include, for instance, polyvinyl alcohol, polyethylene glycol, any copolymer thereof, or any combination thereof. Some or other examples of suitable water-soluble thermoplastic polymers may include, but are not limited to, a polyvinylpyrrolidone, a polyoxazoline (e.g., poly(2-ethyl-2-oxazoline)), a cellulose ester, a polylactic acid, a polylactate, a polycaprolactone, any copolymer thereof, or any combination thereof. Solubility or degradation in aqueous acid solutions is also included within the scope of water solubility in the disclosure herein. Polylactic acid may be effectively degraded through contact with an aqueous acid. Polylactic acid may also be used effectively as non-degradable thermoplastic polymer in the disclosure herein (i.e., as a build material), provided that a printed part formed therefrom is only exposed to conditions chosen so as not to degrade the polylactic acid (i.e., non-acidic conditions). Similar considerations apply to polyesters like polycaprolactones, which may likewise be degradable under aqueous acid conditions but may be suitably used as a non-degradable thermoplastic polymer if not exposed to conditions that promote their degradation.

When a first polymer material and a second polymer material are combined to form a co-continuous phase, particularly a co-continuous phase containing a dissolvable or degradable thermoplastic polymer in combination with a thermally curable polymer precursor, optionally in further combination with a non-dissolvable or non-degradable thermoplastic polymer, and also containing piezoelectric particles, the ratio of the first polymer material to the second polymer material may vary over a wide range. In non-limiting examples, a ratio of the first polymer material to the second polymer material may range from about 1:99 to about 99:1 by volume. In more specific examples, a volume ratio of the first polymer material to the second polymer material may range from about 10:90 to about 90:10, or about 20:80 to about 80:20, or about 25:75 to about 75:25, or about 30:70 to about 70:30, or about 40:60 to about 60:40, or about 10:90 to about 20:80, or about 20:80 to about 30:70, or about 30:70 to about 40:60, or about 40:60 to about 50:50, or about 50:50 to about 60:40, or about 60:40 to about 70:30, or about 70:30 to about 80:20, or about 80:20 to about 90:10. The ratio of the first polymer material to the second polymer material may be selected such that a desired extent of flexibility is realized once a printed part is formed and the first polymer material is removed following curing, or to tailor the extent of porosity formed in a printed part following curing. When two or more thermoplastic polymers are present in combination with the at least one photocurable polymer precursor, the two or more thermoplastic polymers may be present in any ratio.

After removal of at least a portion of a first polymer material from a printed part, the printed parts may have a degree of porosity commensurate with the amount of the first polymer material that is removed. In non-limiting embodiments, the printed parts may have a porosity ranging from about 5% to about 80%, or about 10% to about 50%, or about 30% to about 70%, based upon the amount of volume removed relative to the total volume of a printed part prior to removal of the first polymer material. The pore size or the channel size of interconnected pores may depend upon the extent of dispersion of the first polymer material in the continuous polymer phase, as well as the amount of the first polymer material that is removed.

Once a first polymer material has been at least partially removed from a printed part following curing, the piezoelectric particles may be present in a crosslinked polymer formed from the thermally curable polymer precursor, optionally blended with a second thermoplastic polymer that is not removed. The total particle:polymer mass ratio may be about 20:80 to about 97:3, based on total mass of the printed part following removal of the first polymer material. These values correspond to a particle:polymer volume percentage ranging from about 2 vol. % to about 80 vol. %.

Preferably, at least a majority of the piezoelectric particles may be localized in one of the polymer materials in the continuous polymer phase defining a composite or printed part formed therefrom. The extent of localization with and/or association between the piezoelectric particles and the second polymer material may be determined based upon the innate distribution of the piezoelectric particles between the first and second polymer materials and the amount of piezoelectric particles lost upon dissolution or degradation of the first polymer material. The piezoelectric particles may be dispersed substantially as individuals in the second polymer material. In non-limiting examples, at least about 80%, at least about 85%, at least about 90%, or at least about 95% of the piezoelectric particles originally blended with the continuous polymer phase may remain associated with the second polymer material once the first polymer material has been removed following curing.

Additive manufacturing processes utilizing the compositions described herein may comprise: providing a composition or composite form factor described herein; depositing the composition layer-by-layer to form a printed part; and heating while or after depositing the composition layer-by-layer to a temperature sufficient to react at least the at least one thermally curable polymer precursor to form an at least partially cured printed part. Optionally, at least a portion of at least one thermoplastic polymer may be removed by dissolution or degradation following curing to introduce porosity into the printed part. Any of the form factors disclosed herein may be utilized in such additive manufacturing processes.

The additive manufacturing methods may further comprise poling at least a portion of the at least partially cured printed part, as discussed in further detail above.

In fused filament fabrication processes utilizing composite filaments disclosed herein, the print head may contain one or more extruders, such that a first polymer filament comprising a build material is deposited from a first extruder. The build material may comprise a composite filament in accordance with the disclosure above. Optionally, a second polymer filament comprising a removable support material may be deposited from a second extruder to form a removable support for defining one or more overhangs in a printed part formed from the build material. Filaments (composite filaments or non-composite filaments) suitable for use in the foregoing manner may range from about 0.5 mm to about 10 mm in diameter, or about 1 mm to about 5 mm in diameter, particularly about 1.5 mm to about 3.5 mm in diameter. Standard filament diameters for many three-dimensional printers employing fused filament fabrication technology are 1.75 mm or 2.85 mm (about 3.0 mm). It is to be recognized that any suitable filament diameter may be used in accordance with the disclosure herein, provided that the filament is compatible with a user's particular printing system. Similarly, the length and/or color of the composite filaments is/are not believed to be particularly limited in the printing processes disclosed herein. Preferably, the composite filaments disclosed herein and utilized in processes for forming a printed part are continuous and of spoolable length, such as at least about 1 foot, or at least about 5 feet, or at least about 10 feet, or at least about 25 feet, or at least about 50 feet, or at least about 100 feet, or at least about 250 feet, or at least about 500 feet, or at least about 1000 feet. The term "spoolable length" means sufficiently long to be wound on a spool or reel. It is to be appreciated that a composite filament of "spoolable length" need not necessarily be spooled, such as when the composite filament is too rigid to be wound onto a spool.

Accordingly, composite filaments produced according to the disclosure herein may have a diameter and length compatible for use in fused filament fabrication additive manufacturing processes. Particularly suitable examples may include composite filament diameters ranging from about 1 mm to about 10 mm. Various filament processing conditions may be utilized to adjust the filament diameter, as explained hereinafter.

Suitable methods for forming composite filaments compatible with fused filament fabrication may take place through melt blending of at least one polymer material and a plurality of piezoelectric particles, which may include melt mixing with stirring, followed by extrusion, or direct extrusion with a twin-screw extruder. More specific melt blending methods may comprise combining at least one thermoplastic polymer, the at least one thermally curable polymer precursor, and a plurality of piezoelectric particles, forming a melt comprising the at least one thermoplastic polymer, the at least one thermally curable polymer precursor, and the piezoelectric particles, blending the melt, optionally with stirring, to form a melt blend comprising the piezoelectric particles distributed therein, and extruding the melt blend to form a composite filament comprising the piezoelectric particles mixed in a substantially non-agglomerated form with the at least one thermoplastic polymer and the at least one thermally curable polymer precursor. Composite pellets of the present disclosure may be formed in a similar manner, but without extruding directly into a filament form. Instead, the composite may be extruded into a larger diameter fiber that may be cut, shredded, pulverized, ground, or the like to afford composite pellets having a similar morphology to the composite filaments.

Composite powders may be obtained by grinding, milling, pulverizing, or similar processes to produce non-elongate particulates having an irregular shape and a particle size of about 10 microns to about 1 mm, or about 10 microns to about 500 microns, or about 10 microns to about 100 microns. The particle size distribution may be relatively wide when composite powders are produced by grinding, but the particle size distribution may be narrowed by sieving or a similar size sorting technique, if desired.

In further embodiments, the melt blend may be additionally processed before extruding takes place (e.g., in instances where melt blending takes place prior to extrusion). In particular, the melt blend may be cooled and solidified (e.g., below the melting point or softening temperature of a thermoplastic polymer), and cryogenically milling the melt blend after solidifying and prior to extruding the melt blend. Cryogenic milling will be familiar to one having ordinary skill in the art and may be conducted to reduce the particle size of the melt blend with lower risk of localized heating of the thermoplastic polymer, thermally curable polymer precursor, and/or the piezoelectric particles taking place and promoting degradation or curing thereof. Although cryogenic milling may be advantageous, it is to be appreciated that non-cryogenic milling may also be conducted, or the melt blend may be extruded directly without being cooled and solidified first in alternative process variations. Shredding or grinding of the melt blend may also be conducted prior to extrusion as an alternative process variation. In some instances, composite pellets may likewise be obtained without proceeding through a secondary extrusion process.

In some or other embodiments, melt blending methods for forming composites may include de-agglomeration of a piezoelectric material. In particular, piezoelectric particles employed to form the melt blends may be obtained by probe sonication, specifically probe sonication of larger piezoelectric particles or agglomerates thereof, wherein the input of sonic energy promotes de-agglomeration and formation of a reduced particle size. Homogenization or ball milling may similarly promote de-agglomeration. In more specific examples, PZT particles or similar piezoelectric particles processed by probe sonication may have an average particle size of about 10 microns or less, such as a particle size ranging from about 1 micron to about 5 microns, or about 1 micron to about 2 microns. These piezoelectric particle sizes may be maintained in the composites disclosed herein, with the piezoelectric particles remaining in a substantially non-agglomerated form once blended with a polymer material to define a composite or within a printed part.

Additive manufacturing processes described herein may comprise providing a composition of the present disclosure, specifically a composite filament, a composite pellet, a composite powder, or a composite paste, and forming a printed part by depositing the composition layer-by-layer. Suitable layer-by-layer deposition techniques will be familiar to one having ordinary skill in the art and may be selected based upon the chosen form of the composite. In non-limiting examples, suitable layer-by-layer deposition techniques may include fused filament fabrication, direct writing, or any combination thereof. Curing may take place thermally after forming at least a portion of the printed part. When the polymer material comprises at least one thermoplastic polymer, the composition may be heated at or above a melting point or softening temperature of the at least one thermoplastic polymer when forming the printed part, but below the temperature at which curing takes place. Thus, once the at least one thermoplastic polymer cools, a printed part having a specified shape may be realized. Optionally, porosity may be introduced in a printed part following curing, as discussed in further detail above. Poling at least a portion of the printed part may also take place to induce a piezoelectric response therein.

In more specific embodiments, additive manufacturing processes may comprise providing a composition of the present disclosure, depositing the composition layer-by-layer to form a printed part, and heating while or after depositing the composition layer-by-layer to a temperature sufficient to react at least the at least one thermally curable polymer precursor or the thermally curable functional group to form an at least partially cured printed part.

Embodiments disclosed herein include:

A. Compositions comprising piezoelectric particles. The compositions comprise: a plurality of piezoelectric particles dispersed in at least a portion of a polymer material comprising at least one thermoplastic polymer and at least one thermally curable polymer precursor.

A1. Printed parts comprising the composition of A, optionally wherein the at least one thermally curable polymer precursor is in a covalently crosslinked polymer form.

B. Compositions comprising piezoelectric particles. The compositions comprise: a plurality of piezoelectric particles dispersed in at least a portion of a polymer material comprising at least one thermoplastic polymer comprising a thermally curable functional group.

B1. Printed parts comprising the composition of B, optionally wherein the thermally curable functional group is in a covalently crosslinked form.

C. Additive manufacturing processes. The processes comprise: providing the composition of A or the composition of B; depositing the composition layer-by-layer to form a printed part; and heating while or after depositing the composition layer-by-layer to a temperature sufficient to react at least the at least one thermally curable polymer precursor or the thermally curable functional group to form an at least partially cured printed part.

Each of embodiments A, A1, B, B1 and C may have one or more of the following additional elements in any combination:

Element 1: wherein the polymer material and the piezoelectric particles collectively define an extrudable material that is a composite having a form factor selected from the group consisting of a composite filament, a composite pellet, a composite powder, and a composite paste.

Element 2: wherein the piezoelectric particles are uniformly dispersed in at least a portion of the polymer material.

Element 3: wherein the piezoelectric particles comprise about 10 vol. % to about 85 vol. % of the composite.

Element 4: wherein the polymer material and the piezoelectric particles collectively define an extrudable material that is a composite filament.

Element 5: wherein the piezoelectric particles are thermally curable.

Element 6: wherein the at least one thermally curable polymer precursor is crosslinkable by thermally generated free radicals.

Element 7: wherein the piezoelectric particles, the at least one thermoplastic polymer, or any combination thereof comprises a thermally curable functional group.

Element 8: wherein the piezoelectric particles are substantially non-agglomerated when combined with the polymer material.

Element 9: wherein the piezoelectric particles have an average particle size of about 10 microns or less.

Element 10: wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof.

Element 11: wherein the at least one thermally curable polymer precursor is immiscible with the at least one thermoplastic polymer, or the at least one thermally curable polymer precursor is polymerizable to a covalently crosslinked polymer that is immiscible with the at least one thermoplastic polymer.

Element 12: wherein the at least one thermoplastic polymer is dissolvable or degradable at conditions under which the covalently crosslinked polymer obtained from the at least one thermally curable polymer precursor is non-dissolvable or non-degradable.

Element 13: wherein the piezoelectric particles are substantially localized in the at least one thermally curable polymer precursor or the covalently crosslinked polymer obtained from the at least one thermally curable polymer precursor.

Element 14: wherein the at least one thermoplastic polymer and the at least one thermally curable polymer precursor are distributed co-continuously.

Element 15: wherein the composition further comprises at least one thermal initiator.

Element 16: wherein the composition further comprises at least one thermally curable polymer precursor.

Element 17: wherein the process further comprises poling at least a portion of the at least partially cured printed part.

Element 18: wherein the polymer material and the piezoelectric particles collectively define an extrudable material that is a composite filament, and the printed part is formed by a fused filament fabrication process.

Element 19: wherein the piezoelectric particles are thermally curable, and the piezoelectric particles are reacted with each other, the at least one thermally curable polymer precursor, the thermally curable functional group, or any combination thereof at the temperature sufficient to react at least the at least one thermally curable polymer precursor or the thermally curable functional group.

Element 20: wherein the process further comprises removing at least a portion of the at least one thermoplastic polymer from the at least partially cured printed part by dissolution or degradation of the at least one thermoplastic polymer.

Element 21: wherein the at least one thermally curable polymer precursor is in a covalently crosslinked polymer form.

Element 22: wherein the piezoelectric particles are thermally curable, and the piezoelectric particles are reacted with each other, the crosslinked polymer form of the at least one thermally curable polymer precursor, or any combination thereof.

By way of non-limiting example, exemplary combinations applicable to A, A1, B, B1, and C include, but are not limited to: 1 or 4, and 2; 1 or 4, and 3; 1 or 4, and 5; 1 or 4, and 6; 1 or 4, and 7; 1 or 4, and 8; 1 or 4, and 9; 1 or 4, and 10; 1 or 4, and 11; 1 or 4, and 11 or 12; 1 or 4, and 13; 1 or 4, and 11 or 13; 1 or 4, and 14; 1 or 4, and 11 or 14; 1 or 4, and 15; 2 and 3; 2 and 5; 2 and 6; 2 and 7; 2 and 8; 2 and 9; 2 and 10; 2 and 11; 2, and 11 or 12; 2 and 13; 2, and 11 or 13; 2 and 14; 2, and 11 or 14; 2 and 15; 3 and 5; 3 and 6; 3 and 7; 3 and 8; 3 and 9; 3 and 10; 3 and 11; 3, and 11 or 12; 3 and 13; 3, and 11 or 13; 3 and 14; 3, and 11 or 14; 3 and 15; 5 and 6; 5 and 7; 5 and 8; 5 and 9; 5 and 10; 5 and 11; 5, and 11 or 12; 5 and 13; 5, and 11 or 13; 5 and 14; 5, and 11 or 14; 5 and 15; 6 and 7; 6 and 8; 6 and 9; 6 and 10; 6 and 11; 6, and 11 or 12; 6 and 13; 6, and 11 or 13; 6 and 14; 6, and 11 or 14; 6 and 15; 7 and 8; 7 and 9; 7 and 10; 7 and 11; 7, and 11 or 12; 7 and 13; 7, and 11 or 13; 7 and 14; 7, and 11 or 14; 7 and 15; 8 and 9; 8 and 10; 8 and 11; 8, and 11 or 12; 8 and 13; 8, and 11 or 13; 8 and 14; 8, and 11 or 14; 8 and 15; 9 and 10; 9 and 11; 9, and 11 or 12; 9 and 13; 9, and 11 or 13; 9 and 14; 9, and 11 or 14; 9 and 15; 10 and 11; 10, and 11 or 12; 10 and 13; 10, and 11 or 13; 10 and 14; 10, and 11 or 14; 10 and 15; 11 and 12; 11 and 13; 11 and 14; 11 and 15; 11-13; 11, 12, and 14; 11, 12, and 15; 13 and 14; 13 and 15; 11, 13, and 14; 11, 13, and 15; 14 and 15; and 11, 14, and 15. With respect to C, any of the foregoing may be in further combination with one or more of 17, 18, 19, 20, 21, or 22.

CLAUSES OF THE DISCLOSURE

The present disclosure is further directed to the following non-limiting embodiments:

Clause 1. A composition comprising:

a plurality of piezoelectric particles dispersed in at least a portion of a polymer material comprising at least one thermoplastic polymer and at least one thermally curable polymer precursor.

Clause 2. The composition of clause 1, wherein the polymer material and the piezoelectric particles collectively define an extrudable material that is a composite having a form factor selected from the group consisting of a composite filament, a composite pellet, a composite powder, and a composite paste.

Clause 3. The composition of clause 1 or clause 2, or the composition of clause 2, wherein the piezoelectric particles are uniformly dispersed in at least a portion of the polymer material.

Clause 4. The composition of clause 2 or clause 3, or the composition of clause 2, wherein the piezoelectric particles comprise about 10 vol. % to about 85 vol. % of the composite.

Clause 5. The composition of any one of clauses 1-4, or the composition of clause 1, wherein the polymer material and the piezoelectric particles collectively define an extrudable material that is a composite filament.

Clause 6. The composition of any one of clauses 1-5, or the composition of clause 1, wherein the piezoelectric particles are thermally curable.

Clause 7. The composition of any one of clauses 1-6, or the composition of clause 1, wherein the at least one thermally curable polymer precursor is crosslinkable by thermally generated free radicals.

Clause 8. The composition of any one of clauses 1-7, or the composition of clause 1, wherein the piezoelectric particles, the at least one thermoplastic polymer, or any combination thereof comprises a thermally curable functional group.

Clause 9. The composition of any one of clauses 1-8, or the composition of clause 1, wherein the piezoelectric particles are substantially non-agglomerated when combined with the polymer material.

Clause 10. The composition of any one of clauses 1-9, or the composition of clause 1, wherein the piezoelectric particles have an average particle size of about 10 microns or less.

Clause 11. The composition of any one of clauses 1-10, or the composition of clause 1, wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof.

Clause 12. The composition of any one of clauses 1-11, or the composition of clause 1, wherein the at least one thermally curable polymer precursor is immiscible with the at least one thermoplastic polymer, or the at least one thermally curable polymer precursor is polymerizable to a covalently crosslinked polymer that is immiscible with the at least one thermoplastic polymer.

Clause 13. The composition of clause 12, wherein the at least one thermoplastic polymer is dissolvable or degradable at conditions under which the covalently crosslinked polymer obtained from the at least one thermally curable polymer precursor is non-dissolvable or non-degradable.

Clause 14. The composition of clause 12 or clause 13, or the composition of clause 12, wherein the piezoelectric particles are substantially localized in the at least one thermally curable polymer precursor or the covalently crosslinked polymer obtained from the at least one thermally curable polymer precursor.

Clause 15. The composition of any one of clauses 12-14, or the composition of clause 12, wherein the at least one thermoplastic polymer and the at least one thermally curable polymer precursor are distributed co-continuously.

Clause 16. The composition of any one of clauses 1-15, or the composition of clause 1, further comprising: at least one thermal initiator.

Clause 17. A composition comprising:

a plurality of piezoelectric particles dispersed in at least a portion of a polymer material comprising at least one thermoplastic polymer comprising a thermally curable functional group.

Clause 18. The composition of clause 17, further comprising: at least one thermally curable polymer precursor.

Clause 19. The composition of clause 17 or clause 18, or the composition of clause 17, wherein the piezoelectric particles are thermally curable.

Clause 20. The composition of any one of clauses 17-19, or the composition of clause 17, wherein the piezoelectric particles are thermally curable.

Clause 21. The composition of any one of clauses 17-20, or the composition of clause 17, wherein the polymer material and the piezoelectric particles collectively define an extrudable material that is a composite having a form factor selected from the group consisting of a composite filament, a composite pellet, a composite powder, and a composite paste.

Clause 22. The composition of any one of clauses 17-21, or the composition of clause 17, further comprising: at least one thermal initiator.

Clause 23. An additive manufacturing process comprising:

providing the composition of any one of clauses 1-16, or the composition of any one of clauses 17-22, or the composition of clause 1, or the composition of clause 17;

depositing the composition layer-by-layer to form a printed part; and heating while or after depositing the composition layer-by-layer to a temperature sufficient to react at least the at least one thermally curable polymer precursor or the thermally curable functional group to form an at least partially cured printed part.

Clause 24. The additive manufacturing process of clause 23, wherein the piezoelectric particles are substantially non-agglomerated when combined with the polymer material.

Clause 25. The additive manufacturing process of clause 23 or clause 24, or the additive manufacturing process of clause 23, wherein the piezoelectric particles have an average particle size of about 10 microns or less.

Clause 26. The additive manufacturing process of any one of clauses 23-25, or the additive manufacturing process of clause 23, further comprising: poling at least a portion of the at least partially cured printed part.

Clause 27. The additive manufacturing process of any one of clauses 23-26, or the additive manufacturing process of clause 23, wherein the polymer material and the piezoelectric particles collectively define an extrudable material that is a composite filament, and the printed part is formed by a fused filament fabrication process.

Clause 28. The additive manufacturing process of any one of clauses 23-27, or the additive manufacturing process of clause 23, wherein the piezoelectric particles are thermally curable, and the piezoelectric particles are reacted with each other, the at least one thermally curable polymer precursor, the thermally curable functional group, or any combination thereof at the temperature sufficient to react at least the at least one thermally curable polymer precursor or the thermally curable functional group.

Clause 29. The additive manufacturing process of any one of clauses 23-28, or the additive manufacturing process of clause 23, further comprising:

removing at least a portion of the at least one thermoplastic polymer from the at least partially cured printed part by dissolution or degradation of the at least one thermoplastic polymer.

Clause 30. A printed part comprising the composition of any one of clauses clause 1-16, or the composition of any one of clauses 17-22, or the composition of clause 1, or the composition of clause 17.

Clause 31. The printed part of clause 30, wherein the at least one thermally curable polymer precursor is in a covalently crosslinked polymer form.

Clause 32. The printed part of clause 30 or clause 31, or the printed part of clause 30, wherein the piezoelectric particles are thermally curable, and the piezoelectric particles are reacted with each other, the crosslinked polymer form of the at least one thermally curable polymer precursor, or any combination thereof.

To facilitate a better understanding of the present disclosure, the following examples of preferred or representative embodiments are given. In no way should the following examples be read to limit, or to define, the scope of the invention.

EXAMPLES

Lead zirconate titanate (PZT, APC International, Ltd.) was sonicated using a Branson digital probe sonicator for 30 minutes in water at 25% amplitude to break up particle agglomerates. The original PZT agglomerate size of approximately 100 microns afforded PZT particles in a 1-5 micron size range following sonication, with a majority of the PZT particles being in a 1-2 micron size range. The PZT particles were dried at 80° C. overnight in a vacuum oven.

Alternately, a suspension of PZT particles in water (250 g PZT particles in 250 g water) was homogenized under high-shear conditions for 30 minutes using an IKA ULTRA-TURRAX T25 homogenizer. The PZT particles were isolated by centrifugation, washed with isopropanol, and dried at 80° C. in a vacuum oven overnight.

The PZT particles were further functionalized upon their surface using 3-(trimethoxysilyl)propyl methacrylate, as described in further detail below in Example 1.

Functionalized and unfunctionalized PZT particles were blended with poly-ε-caprolactone, as specified in the examples below. The poly-ε-caprolactone sources and properties were as follows: 1) Mn=115,000 (Happy Wire Dog, LLC), and 2) Mn=70,000 (Scientific Polymer, Inc.). The polymer samples were formulated with either an aromatic urethane acrylate oligomer (CN935, Sartomer) or an aliphatic urethane acrylate oligomer CN9010 (Sartomer), as specified in the examples below. The thermal initiator was 2,5-di(t-butylperoxy)-2,5-dimethyl-3-hexyne (DBPDH, Sigma-Aldrich). The melting point of DBPDH is 88° C., and it has a thermal half-life of 10 hours at 131° C., 1 hour at 152° C., and 1 minute at 194° C.

Example 1: Functionalization of PZT Particles. Functionalization was conducted by combining 50 g PZT with a mixture of 450 mL isopropanol and 50 mL deionized water in a 1000 mL beaker containing a magnetic stir bar. The mixture was sonicated with a probe sonicator under magnetic stirring for 45 minutes. Pulsing was conducted at 50% amplitude in 1 second intervals, with a 0.5 second interval between pulses. Alternately, de-agglomeration may be conducted as above.

Following sonication, the mixture was transferred to a 1000 mL round bottom flask, and 25 g of 3-(trimethoxysilyl) propyl methacrylate (TPM) was added. The reaction mixture was stirred overnight at room temperature and then heated to 80° C. for 3 hours with magnetic stirring. After cooling to room temperature, the functionalized PZT particles were isolated by centrifugation and washed twice with isopropanol. The functionalized PZT particles (PZT-Acr) were dried at 60° C. under vacuum overnight.

Figure 3:
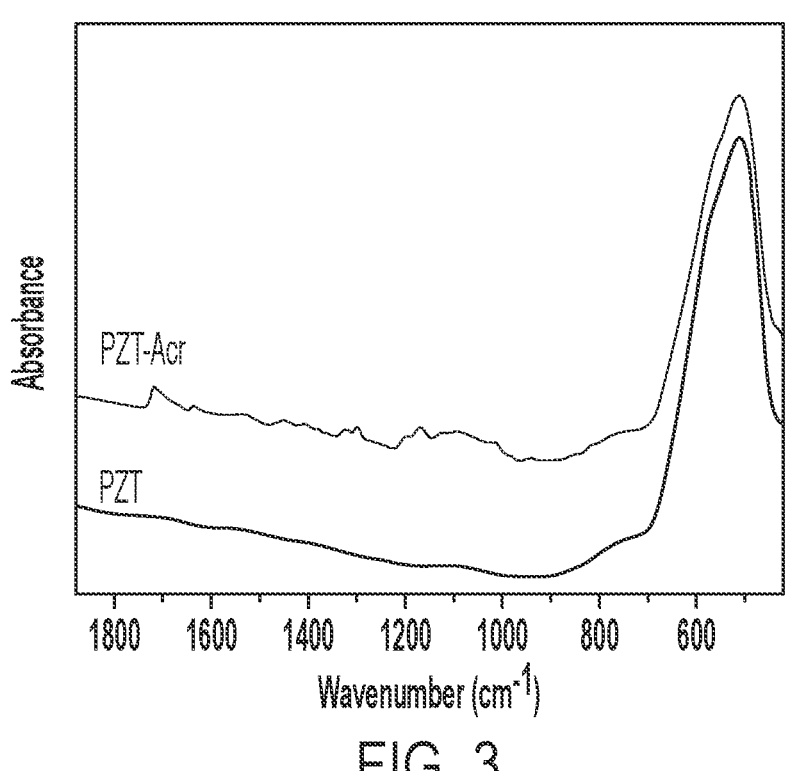
FIG. 3 is an illustrative overlay of FTIR spectra of PZT particles and PZT-Acr particles.

The PZT-Acr particles were further characterized by infrared spectroscopy, thermogravimetric analysis, and carbon/hydrogen/nitrogen analyses. Based upon these analyses the incorporation of 3-(trimethoxysilyl)propyl methacrylate was determined at 3.3 wt. %, based on total mass (13.4 mmol silane/methacrylate per 100 g PZT particles). FIG. 3 is an illustrative overlay of FTIR spectra of PZT particles and PZT-Acr particles. As shown, the FTIR spectrum of unfunctionalized PZT particles was largely featureless, except for a large peak near 510 cm$^{-1}$, corresponding to metal-O-metal bonds. This peak was maintained in the FTIR spectrum of PZT-Acr particles, which also showed ingrowth of additional peaks at 1715 cm$^{-1}$, 1634 cm$^{-1}$, and 1080 cm$^{-1}$ corresponding to the appended methacrylate group.

Example 2: Formation of a 40 vol. % PZT/PCL/Acrylate Composite Containing 10 wt. % DBPDH Thermal initiator. PZT was combined with poly-ε-caprolactone (PCL) (Scientific Polymer, Inc.) at 40 vol. %, based on total volume, and the resulting mixture was blended in a Haake compounder at 80° C. Blending was conducted by placing 22.8 g of PCL pellets in the Haake compounder and melting under mixing conditions. 11.8 g of aromatic urethane acrylate oligomer CN975 was added, and mixing was continued for 3 minutes. The ratio of PCL to acrylate oligomer was 2:1 on a volume basis. 153.4 g PZT particles (unfunctionalized) were then combined with the molten mixture. After 10-15 minutes of blending, 1.18 g of DBPDH thermal initiator (10 wt. % of acrylate oligomer) was added and 5 additional minutes of mixing followed. The temperature was maintained below 92° C. at all times. After mixing was completed, the mixture was discharged onto an aluminum pan and cooled to ambient temperature. Shredding was then conducted with a SHR3D IT shredder (3devo).

Example 3: Formation of a 40 vol. % PZT/PCL/Acrylate Composite Containing a 10 wt. % DBPDH Thermal initiator. This composite was prepared as described for Example 2, except an aliphatic urethane acrylate oligomer (CN9010, 12.0 g) was substituted for the aromatic acrylate oligomer, and 1.2 g of the DBPDH thermal initiator was used. The PZT particles were again unfunctionalized in this example. The temperature was maintained below 88° C. at all times.

Example 4: Formation of a 40 vol. % PZT-Acr/PCL/ Acrylate Composite Containing 10 wt. % DBPDH Thermal initiator. This composite was prepared as described for Example 3, except PZT-Acr particles were used. The temperature was maintained below 91° C. at all times.

Example 5 (Comparative): Formation of a 40 vol. % PZT/PCL Composite. PZT was combined with poly-ε-caprolactone (PCL) (Happy Dog Wire, LLC) at 40 vol. %, based on total volume, and the resulting mixture was blended in a Haake compounder at 100° C. Blending was conducted by placing 34.4 g of PCL pellets in the Haake compounder and melting under mixing conditions. 153.4 g of PZT particles (unfunctionalized) were then combined with the molten mixture. After 10-15 minutes of blending the mixture was discharged onto an aluminum pan and cooled to ambient temperature. Shredding was then conducted with a SHR3D IT shredder (3devo). The temperature was maintained below 115° C. at all times.

Samples from Examples 2-5 are summarized in Table 1 below.

TABLE 1

| | PCL (vol. % of total) | CN975 Aromatic Acrylate Oligomer (vol. % of total) | CN9010 Aliphatic Acrylate Oligomer (vol. % of total) | PZT (vol. % of total) | DBPDH (wt. % of Acrylate Oligomer) |
|---|---|---|---|---|---|
| Example 2 (Exp.) | 40 | 20 | — | 40 (PZT) | 10 |
| Example 3 (Exp.) | 40 | — | 20 | 40 (PZT) | 10 |
| Example 4 (Exp.) | 40 | — | 20 | 40 (PZT-Acr) | 10 |
| Example 5 (Comp.) | 60 | — | — | 40 (PZT) | — |

Filament Extrusion. For filament extrusion, the samples were first shredded to afford a coarse powder, and the powder was then extruded using a single-screw Filabot EX6 extruder. The extruder was modified with a digital voltage readout to control the motor speed and extrusion rate. The Filabot EX6 filament extruder is capable of zonal temperature variation among the feed port nozzle, a back zone, a middle zone, and a front zone. The air path of the Filabot EX6 filament extruder may be further adjusted with respect to distance from the feed port nozzle or by raising the air path on a jack. The air path height was kept constant here, and 100% airflow was used during extrusion. Table 2 below summarizes the extrusion conditions and filament properties used when preparing composite filaments from the composites of Examples 1 and 3 (experimental samples) and Example 4 (comparative sample). Measurement of the filament diameter was conducted using an inline thickness gauge.

TABLE 2

| Feed Material Source | Example 1 (Experimental) | Example 3 (Experimental) | Example 4 (Comparative) |
|---|---|---|---|
| Feed Temperature | 30° C. | 30° C. | 30° C. |
| Back Temperature | 90° C. | 90° C. | 110° C. |
| Middle Temperature | 90° C. | 90° C. | 110° C. |
| Front Temperature | 90° C. | 90° C. | 90° C. |
| Voltage | 15 V | 20 V | 22 V |
| Nozzle size | 1.75 mm | 1.75 mm | 2.0 mm |
| Air flow | 100% | 100% | 100% |
| Average filament diameter | 1.4-1.6 mm | 1.2-1.4 mm | 1.6-1.7 mm |

Printed Samples. The filaments made above were printed as 20 mm squares of varying thicknesses using a Hyrel Hydra 16 A printer under the printing conditions specified in Table 3 below. The printed squares were cooled to room temperature before removal from the glass plate.

TABLE 3

| Filament Material Source | Example 1 (Experimental) | Example 3 (Experimental) |
|---|---|---|
| Nozzle | 0.5 mm | 0.5 mm |
| Extruder Temperature | 120° C. | 120° C. |
| Bed | Glass plate | Glass plate |
| Adhesive | None | None |
| Bed Temperature | 40° C. | 40° C. |
| Print Speed | 20 mm/s | 20 mm/s |

Piezoelectric Properties. Piezoelectric properties of thermopressed samples were evaluated by measuring $d_{33}$ values using an APC International Wide-Range $d_{33}$ meter or a Piezotest PM300 Piezo meter. The $d_{33}$ meter is capable of measuring $d_{33}$ values between 1-2000 pC/N at an operating frequency of 110 Hz and an amplitude of 0.25 N. The $d_{33}$ value represents the quantity of charge generated when a piezoelectric material is subjected to a set applied force (amplitude). Thermopressed samples were made by compressing the samples into 150 μm to 1 mm thick disks using a Carver hydraulic press with the samples heated at 90° C. in a mold. The $d_{33}$ values were measured both before and after curing. Curing was conducted by heating the samples at 200° C. for 5 minutes in the Carver hydraulic press. Further description of the thermopressed samples and their piezoelectric properties, before and after curing, are provided in Table 4 below.

Prior to making the $d_{33}$ measurements, all samples were poled by a corona poling method in which the sample was exposed to a corona discharge for times ranging from 2 to 60 minutes, but more typically 30 minutes. In the corona poling method, the sample was first coated with a thin layer of sputtered metal (Au, Pt, or Al) on one side of the sample, which was then exposed to a wire-generated corona (6-8 kV) located at a distance of about 1 mm from the sample. Since a surface area of approximately 300 μm² is exposed to the corona at a given time, the sample was moved to pole the complete surface through exposure to the corona. The poling process was not optimized. Contact poling in a high dielectric medium may be used as an alternative poling procedure.

TABLE 4

| Entry | Composite | Sample Type | Sample Thickness (μm) | Avg. $d_{33}$ Value-uncured (pC/N) | Avg. $d_{33}$ Value-cured (pC/N) |
|---|---|---|---|---|---|
| 1a | Example 2 (Exp.) | Thermopressed | 700 | 5 | — |
| 1b | Example 2 (Exp.) | Thermopressed | 600 | — | 7 |
| 2a | Example 3 (Exp.) | Thermopressed | 500 | 3.7 | — |
| 2b | Example 3 (Exp.) | Thermopressed | 500 | — | 4.4 |
| 3a | Example 4 (Exp.) | Thermopressed | 700 | 5 | — |
| 3b | Example 4 (Exp.) | Thermopressed | 500 | — | 12 |
| 4 | Example 5 (Comp.) | Thermopressed | 500 | 4.5 | — |

As shown, all cured samples exhibited higher $d_{33}$ values than did their uncured counterparts. When the PZT particles were also curable, the increase was greater than when only a thermally curable acrylate oligomer was present (comparing Entries 3a/b against Entries 1a/1b and Entries 2a/2b). Moreover, comparing the uncured $d_{33}$ values of Entries 1a, 2a, and 3a against Entry 4, it can be seen that unfunctionalized and functionalized PZT particles both produced similar $d_{33}$ values when the PZT particles were present at a similar volume percentage.

Mechanical Properties. Mechanical properties were measured for uncured and cured samples obtained by thermopressing the composites of Examples 2-4 into dogbone-shape molds. Curing was conducted as above. The measurements were conducted using ASTM D638-14 Standard Test Method on an Instron 3367 instrument at a rate of 5 mm/min. Testing results are summarized in Table 5 below.

TABLE 5

| | Example 2 | | Example 3 | | Example 4 | |
|---|---|---|---|---|---|---|
| | Uncured | Cured | Uncured | Cured | Uncured | Cured |
| Young's Modulus (MPa) | 179 ± 23 | 1040 ± 48 | 66 ± 6 | 1180 ± 117 | 150 ± 10 | 1310 ± 147 |
| Tensile Strength (MPa) | 3.7 ± 0.2 | 19.5 ± 1.6 | 4.4 ± 0.2 | 17 ± 6 | 4.4 ± 0.6 | 23 ± 4 |
| Elongation at Break (%) | 3.4 ± 0.9 | sharp break | 11.3 ± 0.2 | sharp break | 5.6 ± 1.4 | sharp break |
| Nominal Strain at Break (%) | 13.6 ± 3.6 | 3.1 ± 0.3 | >100 | 2.7 ± 0.6 | 14 ± 5 | 3.1 ± 0.5 |

As shown, all values increased upon curing, but the increase was larger for sample having both the thermally curable acrylate oligomer and the acrylate-functionalized PZT particles (composite of Example 4). The sharp elongation at break value is indicative of the presence of a rigid crosslinked polymer network within the PCL matrix.

All documents described herein are incorporated by reference herein for purposes of all jurisdictions where such practice is allowed, including any priority documents and/or testing procedures to the extent they are not inconsistent with this text. As is apparent from the foregoing general description and the specific embodiments, while forms of the disclosure have been illustrated and described, various modifications can be made without departing from the spirit and scope of the disclosure. Accordingly, it is not intended that the disclosure be limited thereby. For example, the compositions described herein may be free of any component, or composition not expressly recited or disclosed herein. Any method may lack any step not recited or disclosed herein. Likewise, the term "comprising" is considered synonymous with the term "including." Whenever a method, composition, element or group of elements is preceded with the transitional phrase "comprising," it is understood that we also contemplate the same composition or group of elements with transitional phrases "consisting essentially of," "consisting of," "selected from the group consisting of," or "is" preceding the recitation of the composition, element, or elements and vice versa.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee.

Moreover, the indefinite articles "a" or "an," as used in the claims, are defined herein to mean one or more than one of the element that it introduces.

One or more illustrative embodiments are presented herein. Not all features of a physical implementation are described or shown in this application for the sake of clarity. It is understood that in the development of a physical embodiment of the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for one of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to one having ordinary skill in the art and having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein.

What is claimed is the following:

1. A composition comprising:
   a plurality of piezoelectric particles dispersed in at least a portion of a polymer material comprising at least one thermoplastic polymer and at least one thermally curable polymer precursor, wherein the polymer material and the piezoelectric particles collectively define an extrudable material that is a composite filament.

2. The composition of claim 1, wherein the piezoelectric particles are thermally curable and comprise a thermally curable functional group.

3. The composition of claim 1, wherein the at least one thermally curable polymer precursor is crosslinkable by thermally generated free radicals.

4. The composition of claim 1, wherein the piezoelectric particles are substantially non-agglomerated when combined with the polymer material.

5. The composition of claim 1, wherein the piezoelectric particles have an average particle size of about 10 microns or less.

6. The composition of claim 1, further comprising: at least one thermal initiator.

7. A composition, comprising:
   a plurality of piezoelectric particles dispersed in at least a portion of a polymer material comprising at least one thermoplastic polymer and at least one thermally curable polymer precursor, wherein the piezoelectric particles, the at least one thermoplastic polymer, or any combination thereof comprises a thermally curable functional group.

8. The composition of claim 7, wherein the polymer material and the piezoelectric particles collectively define an extrudable material that is a composite having a form factor selected from the group consisting of a composite filament, a composite pellet, a composite powder, and a composite paste.

9. The composition of claim 8, wherein the piezoelectric particles are uniformly dispersed in at least a portion of the polymer material.

10. The composition of claim 7, wherein the at least one thermoplastic polymer comprises a thermally curable functional group.

11. The composition of claim 10, wherein the piezoelectric particles are thermally curable and comprise a thermally curable functional group.

12. The composition of claim 10, wherein the polymer material and the piezoelectric particles collectively define an extrudable material that is a composite having a form factor selected from the group consisting of a composite filament, a composite pellet, a composite powder, and a composite paste.

13. The composition of claim 10, further comprising: at least one thermal initiator.

14. An additive manufacturing process comprising:
   providing the composition of claim 1;
   depositing the composition layer-by-layer to form a printed part; and
   heating while or after depositing the composition layer-by-layer to a temperature sufficient to react at least the at least one thermally curable polymer precursor to form an at least partially cured printed part.

15. The additive manufacturing process of claim 14, wherein the piezoelectric particles are substantially non-agglomerated when combined with the polymer material.

16. The additive manufacturing process of claim 14, wherein the printed part is formed by a fused filament fabrication process.

17. The additive manufacturing process of claim 14, wherein the piezoelectric particles are thermally curable and comprise a thermally curable functional group, and the piezoelectric particles are reacted with each other, the at least one thermally curable polymer precursor, or any combination thereof at the temperature sufficient to react at least the at least one thermally curable polymer precursor.

18. A printed part comprising the composition of claim 1.

19. The printed part of claim 18, wherein the at least one thermally curable polymer precursor is in a covalently crosslinked polymer form.

* * * * *